United States Patent
Gotoda et al.

(10) Patent No.: US 9,006,013 B2
(45) Date of Patent: Apr. 14, 2015

(54) METHOD FOR MANUFACTURING SEMICONDUCTOR LIGHT EMITTING DEVICE AND SEMICONDUCTOR LIGHT EMITTING DEVICE WAFER

(75) Inventors: Toru Gotoda, Kanagawa-ken (JP); Toshiyuki Oka, Kanagawa-ken (JP); Shinya Nunoue, Chiba-ken (JP); Kotaro Zaima, Tokyo (JP); Hiroshi Ono, Tokyo (JP); Hajime Nago, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 472 days.

(21) Appl. No.: 13/405,634

(22) Filed: Feb. 27, 2012

(65) Prior Publication Data
US 2012/0319161 A1 Dec. 20, 2012

(30) Foreign Application Priority Data
Jun. 17, 2011 (JP) ................. 2011-134969

(51) Int. Cl.
| | | |
|---|---|---|
| H01L 21/00 | (2006.01) | |
| H01L 21/30 | (2006.01) | |
| H01L 21/46 | (2006.01) | |
| H01L 33/00 | (2010.01) | |
| H01L 21/20 | (2006.01) | |
| H01L 33/20 | (2010.01) | |
| H01S 5/02 | (2006.01) | |
| H01S 5/323 | (2006.01) | |

(52) U.S. Cl.
CPC .......... *H01L 33/007* (2013.01); *H01L 21/2011* (2013.01); *H01L 33/0079* (2013.01); *H01L 33/20* (2013.01); *H01S 5/0217* (2013.01); *H01S 5/32341* (2013.01); *H01S 5/0213* (2013.01)

(58) Field of Classification Search
CPC ................................................ H01L 21/2011
USPC ........................................................... 438/43
See application file for complete search history.

(56) References Cited

U.S. PATENT DOCUMENTS

| | | | |
|---|---|---|---|
| 6,303,405 | B1 | 10/2001 | Yoshida et al. |
| 2011/0039356 | A1 | 2/2011 | Ando et al. |
| 2011/0042718 | A1 | 2/2011 | Wang et al. |

FOREIGN PATENT DOCUMENTS

| | | |
|---|---|---|
| JP | 2000-101139 A | 4/2000 |
| JP | 2007-184503 | 7/2007 |
| JP | 2007-184504 | 7/2007 |
| JP | 2007-214500 | 8/2007 |
| JP | 2009-283807 A | 12/2009 |
| JP | 2011-40564 A | 2/2011 |

OTHER PUBLICATIONS

Japanese Office Action issued Jul. 4, 2014 in Patent Application No. 2011-134969 with English Translation.

*Primary Examiner* — Daniel Luke
(74) *Attorney, Agent, or Firm* — Oblon, McClelland, Maier & Neustadt, L.L.P.

(57) ABSTRACT

According to one embodiment, a method is disclosed for manufacturing a semiconductor light emitting device. The method can include forming a nitride semiconductor layer including a light emitting layer on a first substrate having an unevenness, bonding the nitride layer to a second substrate, and separating the first substrate from the nitride layer by irradiating the nitride layer with light. The forming the nitride layer includes leaving a cavity in a space inside a depression of the unevenness while forming a thin film on the depression. The film includes a same material as part of the nitride layer. The separating includes causing the film to absorb part of the light so that intensity of the light applied to a portion of the nitride layer facing the depression is made lower than intensity of the light applied to a portion facing a protrusion of the unevenness.

17 Claims, 14 Drawing Sheets

METHOD FOR MANUFACTURING SEMICONDUCTOR LIGHT EMITTING DEVICE AND SEMICONDUCTOR LIGHT EMITTING DEVICE WAFER

CROSS-REFERENCE TO RELATED APPLICATIONS

This application is based upon and claims the benefit of priority from the prior Japanese Patent Application No. 2011-134969, filed on Jun. 17, 2011; the entire contents of which are incorporated herein by reference.

FIELD

Embodiments described herein relate generally to a method for manufacturing a semiconductor light emitting device and a semiconductor light emitting device wafer.

BACKGROUND

A semiconductor light emitting device such as a laser diode (LD) and light emitting diode (LED) is fabricated by, for instance, crystal growth of nitride semiconductor layers on a substrate made of e.g. sapphire or SiC.

In a semiconductor light emitting device, to achieve high light emission efficiency and high reliability, it is desired to improve heat dissipation. There is a configuration in which a grown nitride semiconductor layer is bonded to a substrate having higher heat dissipation than the growth substrate, which is then removed. In this removal step, the nitride semiconductor layer is prone to cracking and peeling.

DETAILED DESCRIPTION

Figure 1A:
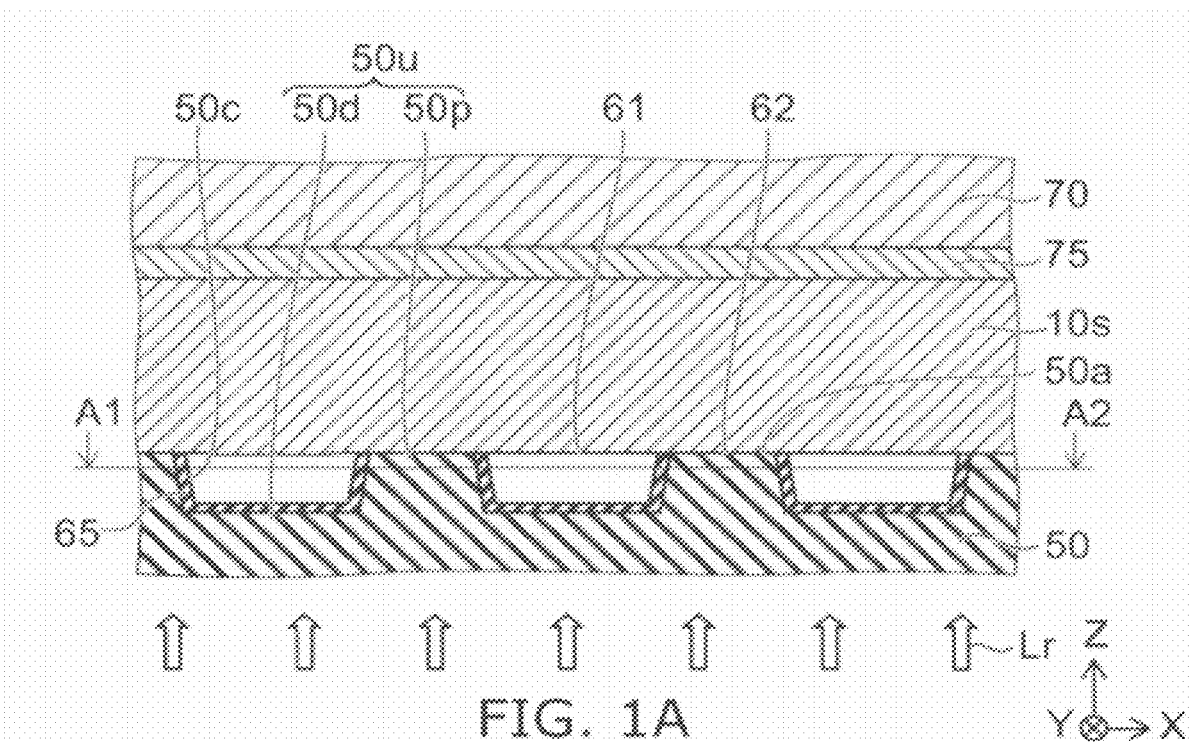
FIGS. 1A and 1B are schematic views illustrating one step of a method for manufacturing a semiconductor light emitting device according to a first embodiment.

According to one embodiment, a method is disclosed for manufacturing a semiconductor light emitting device. The method can include forming a nitride semiconductor layer including a light emitting layer on a major surface of a first substrate having the major surface provided with an unevenness having a depression and a protrusion. The method can include bonding the nitride semiconductor layer to a second substrate. The method can include separating the first substrate from the nitride semiconductor layer by irradiating the nitride semiconductor layer with light via the first substrate. The forming the nitride semiconductor layer includes leaving a cavity in a space inside the depression of the unevenness while forming a thin film on an inner wall surface of the depression of the unevenness. The thin film includes a same material as at least a part of the nitride semiconductor layer. The nitride semiconductor layer includes a first portion facing the depression and a second portion facing the protrusion. The separating includes causing the thin film to absorb at least a part of the light so that an intensity of the light applied to the first portion is made lower than an intensity of the light applied to the second portion.

According to another embodiment, a method is disclosed for manufacturing a semiconductor light emitting device. The method can include bonding a nitride semiconductor layer of a workpiece to a second substrate. The workpiece includes a first substrate having a major surface provided with an unevenness having a depression and a protrusion, the nitride semiconductor layer provided on the major surface and including a light emitting layer, a thin film provided on an inner wall surface of the depression of the unevenness and including a same material as at least a part of the nitride semiconductor layer, and a cavity provided in a space inside the depression. The nitride semiconductor layer includes a first portion facing the depression and a second portion facing the protrusion. In addition, the method can include separating the first substrate from the nitride semiconductor layer by irradiating the nitride semiconductor layer with light via the first substrate. The separating includes causing the thin film to absorb at least a part of the light so that an intensity of the light applied to the first portion is made lower than an intensity of the light applied to the second portion.

According to another embodiment, a semiconductor light emitting device wafer includes a base member, a nitride semiconductor layer, and a thin film. The base member has a major surface provided with an unevenness having a depression. The nitride semiconductor layer is provided on the major surface and includes a light emitting layer. The thin film is provided on an inner wall surface of the depression of the unevenness and includes a same material as at least a part of the nitride semiconductor layer. The nitride semiconductor layer forms a cavity in a space inside the depression.

Various embodiments will be described hereinafter with reference to the accompanying drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification and the drawings, components similar to those described previously with reference to earlier figures are labeled with like reference numerals, and the detailed description thereof is omitted appropriately.

First Embodiment

Figure 1B:
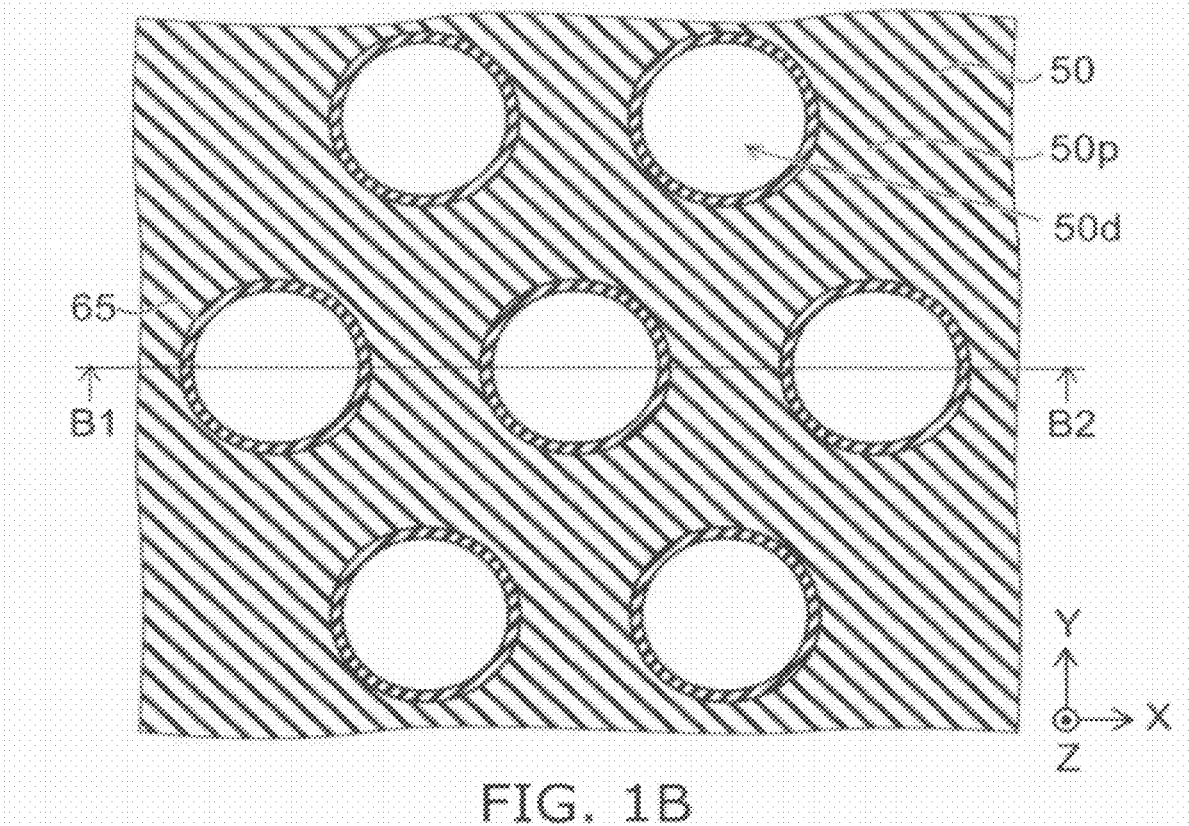

FIGS. 1A and 1B are schematic views illustrating one step of a method for manufacturing a semiconductor light emitting device according to a first embodiment.

More specifically, FIG. 1A is a sectional view taken along line B1-B2 of FIG. 1B. FIG. 1B is a sectional view taken along line A1-A2 of FIG. 1A.

As shown in FIGS. 1A and 1B, the method for manufacturing a semiconductor light emitting device according to the embodiment uses a first substrate 50 (growth substrate) having a major surface 50a provided with an unevenness 50u. On the major surface 50a of the first substrate 50 is provided a nitride semiconductor layer 10s. The nitride semiconductor layer 10s includes a light emitting layer (not shown) described later. The portion of the nitride semiconductor layer 10s facing the first substrate 50 is made of e.g. a GaN layer.

The nitride semiconductor layer 10s is bonded to a second substrate 70. In this example, the nitride semiconductor layer 10s and the second substrate 70 are bonded via an intermediate layer 75. Thus, it is assumed that the case where the nitride semiconductor layer 10s and the second substrate 70 are bonded via a different layer is also included in the case where the nitride semiconductor layer 10s and the second substrate 70 are bonded. Specific examples of the intermediate layer 75 are described later.

The unevenness 50u includes a depression 50d and a protrusion 50p. As shown in FIG. 1B, in this example, the protrusion 50p is continuous, and a plurality of depressions 50d are provided. In this case, as viewed along the axis perpendicular to the major surface 50a, the protrusion 50p surrounds each of the plurality of depressions 50d.

However, as described later, it is also possible that the depression 50d is continuous, and a plurality of protrusions 50p are provided.

In the example shown in FIG. 1B, the planar shape of the depression 50d is circular. The embodiment is not limited thereto. The planar shape of the depression 50d (and the protrusion 50p) is arbitrary.

A thin film 65 is provided on the inner wall surface of the depression 50d of the unevenness 50u. The thin film 65 includes the same material as at least part of the nitride semiconductor layer 10s. In this example, the thin film 65 includes GaN. Furthermore, a cavity 50c exists in the space inside the depression 50d.

In the manufacturing method, the nitride semiconductor layer 10s is irradiated with light Lr via the first substrate 50 to separate the first substrate 50 from the nitride semiconductor layer 10s. This process may be referred to as laser lift-off process.

At least part of the light Lr is transmitted through the substrate 50 and absorbed by the nitride semiconductor layer 10s. The light Lr is based on e.g. a KrF laser with a wavelength of 248 nanometers (nm). The light Lr is absorbed by the portion (GaN layer) of the nitride semiconductor layer 10s facing the first substrate 50, and the portion is decomposed. Thus, the first substrate 50 is removed from the nitride semiconductor layer 10s.

In this step, at least part of the light Lr is absorbed by the thin film 65. Thus, the intensity of light applied to the portion (first portion 61) of the buffer layer 60 facing the depression 50d is made lower than the intensity of light applied to the portion (second portion 62) of the buffer layer 60 facing the protrusion 50p.

The second portion 62 is in contact with the protrusion 50p. The second portion 62 is irradiated with light having an intensity required for removal. By irradiation with the light Lr, the GaN layer of the second portion 62 is decomposed. On the other hand, even if the GaN layer of the first portion 61 irradiated with light having low intensity is not decomposed, the first portion 61 and the first substrate 50 are separated from each other. Hence, by decomposition of the GaN layer of the second portion 62, the first substrate 50 is removed from the nitride semiconductor layer 10s.

In the embodiment, the intensity of light applied to the first portion 61 of the nitride semiconductor layer 10s is low. This suppresses overall damage to the nitride semiconductor layer 10s.

The embodiment can provide a semiconductor light emitting device in which damage to the semiconductor layer (nitride semiconductor layer 10s) in removing the growth substrate is suppressed.

Here, as shown in FIGS. 1A and 1B, the axis perpendicular to the major surface 50a is defined as Z-axis. One axis perpendicular to the Z-axis is defined as X-axis. The axis perpendicular to the Z-axis and the X-axis is defined as Y-axis.

In the following, one example configuration of the semiconductor light emitting device manufactured by the manufacturing method according to the embodiment is described.

Figure 2:
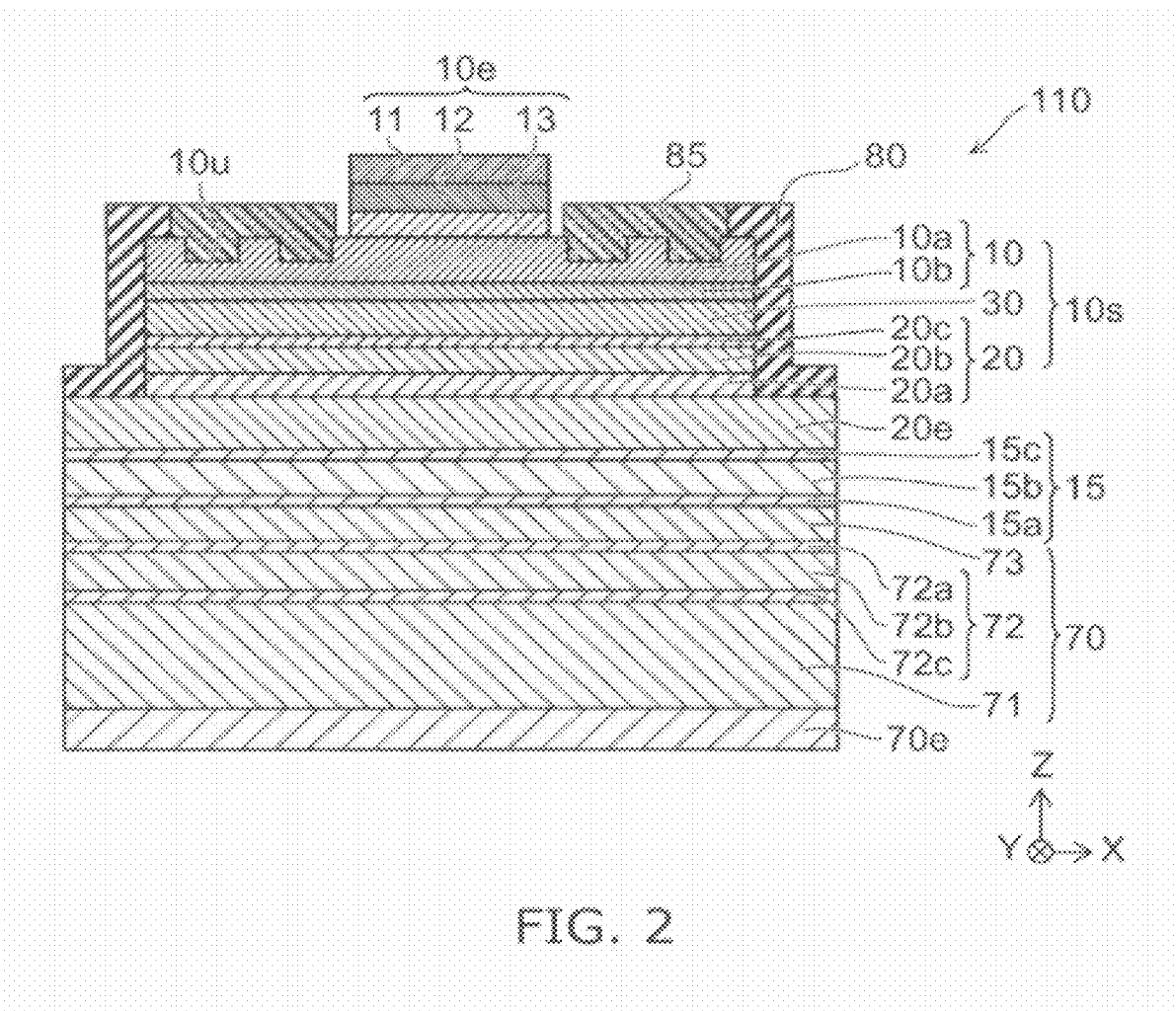
FIG. 2 is a schematic sectional view illustrating a semiconductor light emitting device manufactured by a method for manufacturing a semiconductor light emitting device according to the first embodiment.

FIG. 2 is a schematic sectional view illustrating the configuration of a semiconductor light emitting device manufactured by the method for manufacturing a semiconductor light emitting device according to the first embodiment.

As shown in FIG. 2, the semiconductor light emitting device 110 manufactured by the manufacturing method according to the embodiment includes a first electrode (e.g., n-side electrode 10e), a second electrode (e.g., second substrate electrode 70e), and a nitride semiconductor layer 10s. The nitride semiconductor layer 10s is provided between the first electrode and the second electrode.

The first electrode (e.g., n-side electrode 10e) includes e.g. a first conductive layer 11, a second conductive layer 12, and a third conductive layer 13. The second conductive layer 12 is provided between the first conductive layer 11 and the nitride semiconductor layer 10s. The third conductive layer 13 is provided between the second conductive layer 12 and the nitride semiconductor layer 10s.

The first conductive layer 11 is made of e.g. Au. The second conductive layer 12 is made of e.g. Al. The third conductive layer 13 is made of e.g. Ti. The embodiment is not limited thereto. The material used for the first conductive layer 11, the second conductive layer 12, and the third conductive layer 13 is arbitrary. Furthermore, the first electrode may have a stacked layer structure of four or more layers. For instance, the first electrode may have a four-layer structure of Ti layer/Al layer/Ni layer/Au layer. Alternatively, the first electrode may have a five-layer structure of Ti layer/Al layer/Ta layer/Pt layer/Au.

The nitride semiconductor layer 10s includes a first semiconductor layer 10, a second semiconductor layer 20, and a light emitting layer 30. The light emitting layer 30 is located between the first electrode and the second semiconductor layer 20. The first semiconductor layer 10 is located between the first electrode and the light emitting layer 30.

The first semiconductor layer 10 includes a nitride semiconductor and has a first conductivity type. The second semiconductor layer 20 includes a nitride semiconductor and has a second conductivity type. The second conductivity type is different from the first conductivity type. For instance, the first conductivity type is n-type, and the second conductivity type is p-type. The embodiment is not limited thereto. The first conductivity type may be p-type, and the second conductivity type may be n-type. In the following description, it is assumed that the first conductivity type is n-type, and the second conductivity type is p-type.

The first semiconductor layer 10 is made of e.g. GaN. The first semiconductor layer 10 is doped with impurity such as silicon (Si) and germanium (Ge). The thickness of the first semiconductor layer 10 is e.g. approximately 4 micrometers (μm).

The first semiconductor layer 10 can include e.g. a plurality of n-type layers. The first semiconductor layer 10 includes e.g. a first n-type layer 10a and a second n-type layer 10b. The second n-type layer 10b is provided between the first n-type layer 10a and the light emitting layer 30. The first n-type layer 10a and the second n-type layer 10b are made of e.g. GaN. The first n-type layer 10a functions as e.g. a contact layer. The first n-type layer 10a is in ohmic contact with the first electrode (e.g., n-side electrode 10e). The impurity concentration in the first n-type layer 10a is higher than the impurity concentration in the second n-type layer 10b.

The light emitting layer 30 includes e.g. a plurality of barrier layers (not shown) and a well layer (not shown) provided between the plurality of barrier layers. The light emitting layer 30 can have a single quantum well (SQW) structure. In this case, the light emitting layer 30 includes two barrier layers and a well layer provided between the barrier layers. For instance, the light emitting layer 30 can have a multiple quantum well (MQW) structure. In this case, the light emitting layer 30 includes three or more barrier layers and a well layer provided between each pair of barrier layers.

The well layer includes e.g. $In_{x1}Ga_{1-x1}N$ ($0.05 \leq x1 \leq 0.5$). The barrier layer includes e.g. GaN. In the case where the barrier layer includes In, the In composition ratio in the Group III elements of the barrier layer is lower than the In composition ratio (x1 described above) in the Group III elements of the well layer. Thus, the bandgap energy in the well layer is made smaller than the bandgap energy in the barrier layer. The thickness of the well layer is e.g. 1 nm or more and 5 nm or less. The thickness of the barrier layer is e.g. 3 nm or more and 15 nm or less.

The peak wavelength of light emitted from the light emitting layer 30 is e.g. 400 nm or more and 650 nm or less.

A multilayer structure (e.g., superlattice layer) may be provided between the first semiconductor layer 10 and the light emitting layer 30. The multilayer structure includes a plurality of first films (e.g., GaN films) and a plurality of second films (e.g., InGaN films) alternately stacked in the Z-axis direction.

The second semiconductor layer 20 includes e.g. GaN. The second semiconductor layer 20 is doped with impurity such as magnesium (Mg) and zinc (Zn). The thickness of the second semiconductor layer 20 is e.g. approximately 2 μm.

The second semiconductor layer 20 can include a plurality of p-type layers. The second semiconductor layer 20 includes e.g. a first p-type layer 20a, a second p-type layer 20b, and a third p-type layer 20c. The second p-type layer 20b is provided between the first p-type layer 20a and the light emitting layer 30. The third p-type layer 20c is provided between the second p-type layer 20b and the light emitting layer 30.

The third p-type layer 20c is made of e.g. AlGaN. The third p-type layer 20c functions as e.g. an electron overflow suppression layer. The first p-type layer 20a and the second p-type layer 20b are made of e.g. GaN. The first p-type layer 20a functions as e.g. a contact layer. The impurity concentration in the first p-type layer 20a is higher than the impurity concentration in the second p-type layer 20b. In the case of using Mg as impurity, the impurity concentration in the first p-type layer 20a is e.g. $1 \times 10^{20}$ cm$^{-3}$ or more and $9 \times 10^{21}$ cm$^{-3}$ or less.

In this example, the surface of the first semiconductor layer 10 opposite to the light emitting layer 30 is provided with an unevenness (surface unevenness 10u). The depth of the surface unevenness 10u is e.g. 0.3 μm or more and 5 μm or less. The spacing along the axis perpendicular to the Z-axis between the tops of the surface unevenness 10u is e.g. 0.5 μm or more and 10 μm or less. The surface of the first semiconductor layer 10 provided with the surface unevenness 10u constitutes a light extraction surface.

In this example, the surface unevenness 10u is provided in the portion of the surface of the first semiconductor layer 10 not covered with the n-side electrode 10e. However, the embodiment is not limited thereto. At least part of the region provided with the surface unevenness 10u may be covered with the n-side electrode 10e. The surface unevenness 10u may be provided on the entire surface of the first semiconductor layer 10. The surface unevenness 10u is e.g. a roughened surface. By providing a surface unevenness 10u, the light extraction efficiency of the semiconductor light emitting device 110 is increased.

The thickness of the first electrode (e.g., n-side electrode 10e) is preferably twice or more the depth of the surface unevenness 10u. This stabilizes the electrical connection between the first electrode and the first semiconductor layer 10.

The semiconductor light emitting device 110 can further include a second substrate 70, a second semiconductor layer side electrode (e.g., p-side electrode 20e), and a barrier metal film (e.g., first barrier metal layer 15). The second semiconductor layer side electrode is located between the second electrode (e.g., second substrate electrode 70e) and the nitride semiconductor layer 10s. The barrier metal film is located between the second electrode (e.g., second substrate electrode 70e) and the second semiconductor layer side electrode. The second substrate 70 is located between the second electrode (e.g., second substrate electrode 70e) and the barrier metal film.

The p-side electrode 20e is in ohmic contact with the second semiconductor layer 20. The p-side electrode 20e functions as e.g. an ohmic contact electrode and a high reflection electrode. At least part of the light emitted from the light emitting layer 30 is reflected at the p-side electrode 20e and emitted outside from the light extraction surface on the first semiconductor layer 10 side.

The p-side electrode 20e is made of e.g. Ni. This can reduce the contact resistance with the second semiconductor layer 20. The p-side electrode 20e can be made of e.g. at least one of Ag and Al. This can provide high reflectance.

The inventor has experimentally found that the p-side electrode 20e made of a stacked film of a Ni layer and Ag layer and sintered (heat treated) at approximately 400° C. can achieve ohmic contact and high reflectance. In this case, the thickness of the Ni layer is set to be thin (e.g., 5 nm or less). The thickness of Ag is thicker than that of the Ni layer, and is set to e.g. approximately 200 nm.

The p-side electrode 20e can include at least one of Pt, Ru, Os, Rh, Ir, and Pd. That is, the p-side electrode 20e can be made of a platinum group element. Depending on the impurity concentration and heat treatment condition for the second semiconductor layer 20, metals other than Ni and Ag can also provide ohmic contact.

In this specific example, the width (length along the axis perpendicular to the Z-axis) of the p-side electrode 20e is wider than the width of the second semiconductor layer 20. The embodiment is not limited thereto. The relative relationship between the width of the p-side electrode 20e and the width of the second semiconductor layer 20 is arbitrary.

The first barrier metal layer 15 can include e.g. a first layer 15a, a second layer 15b, and a third layer 15c. The second layer 15b is provided between the first layer 15a and the p-side electrode 20e. The third layer 15c is provided between the second layer 15b and the p-side electrode 20e. The first layer is e.g. an Au layer. The second layer is e.g. a Pt layer. The third layer is e.g. a Ni layer. These layers are formed by e.g. evaporation. Alternatively, these layers may be formed by sputtering.

The first barrier metal layer 15 has the function of e.g. suppressing interdiffusion between the p-side electrode 20e and the bonding layer 73 described later.

The third layer 15c is made of e.g. a metal having high adhesiveness to the p-side electrode 20e. The third layer 15c is preferably made of e.g. at least one of Ti and Ni. The second layer 15b is made of a material having high functionality to suppress interdiffusion between the p-side electrode 20e and the bonding layer 73. The second layer 15b is preferably made of e.g. Pt. The first layer 15a is made of a metal miscible with the bonding layer 73. The first layer 15a is preferably made of e.g. at least one of Au and AuSn.

This configuration can provide high reflectance at the p-side electrode 20e and high bonding strength between the p-side electrode 20e and the bonding layer 73.

The second substrate 70 includes a support substrate 71, a bonding layer 73, and a second barrier metal layer 72. In the semiconductor light emitting device 110, the bonding layer 73 is located between the support substrate 71 and the nitride semiconductor layer 10s. The second barrier metal layer 72 is provided between the support substrate 71 and the bonding layer 73.

The support substrate 71 is an electrically conductive substrate. The thermal conductivity of the support substrate 71 is higher than the thermal conductivity of the first substrate 50. The support substrate 71 is made of e.g. Ge, Si, Cu, and CuW. This can provide electrical conductivity and high heat dissipation.

The thermal expansion coefficient difference between the first substrate 50 and the support substrate 71 may cause large warpage. Large warpage may result in breaking the support substrate 71 during the laser lift-off process. Thus, as the support substrate 71, it is preferable to use a Si substrate or Ge substrate compared with a metal substrate. Furthermore, in view of process compatibility in the singulation (chip formation) step, it is more preferable to use a Si substrate as the support substrate 71.

The second barrier metal layer 72 can include e.g. a fourth layer 72a, a fifth layer 72b, and a sixth layer 72c. The fifth layer 72b is provided between the fourth layer 72a and the support substrate 71. The sixth layer 72c is provided between the fifth layer 72b and the support substrate 71. The fourth layer 72a is e.g. an Au layer. The fifth layer 72b is e.g. a Pt layer. The sixth layer 72c is e.g. a Ni layer. These layers are formed by e.g. evaporation. Alternatively, these layers may be formed by sputtering.

The fourth layer 72a can have the function of mixing with the bonding layer 73. The fifth layer 72b can have the function of e.g. suppressing interdiffusion between the support substrate 71 and the bonding layer 73. The sixth layer 72c can have the function of increasing the adhesiveness between the support substrate 71 and the fifth layer 72b.

The bonding layer 73 is located between the first barrier metal layer 15 and the second barrier metal layer 72. The bonding layer 73 is e.g. an AuSn layer. The nitride semiconductor layer 10s and the support substrate 71 are bonded via the p-side electrode 20e, the first barrier metal layer 15, the bonding layer 73, and the second barrier metal layer 72.

The second substrate electrode 70e is provided on the surface of the second substrate 70 opposite to the nitride semiconductor layer 10s. That is, the second substrate 70 is located between the second substrate electrode 70e and the nitride semiconductor layer 10s. The second substrate electrode 70e can be made of e.g. at least one of Ti, Pt, and Au. This can reduce the resistance between the second substrate electrode 70e and the second substrate 70 (specifically, the support substrate 71 as a Si substrate). Thus, the operating voltage of the semiconductor light emitting device 110 can be reduced.

By applying voltage between the first electrode (e.g., n-side electrode 10e) and the second electrode (e.g., second substrate electrode 70e), a current flows in the light emitting layer 30 via the first semiconductor layer 10, the second semiconductor layer 20, the p-side electrode 20e, the first barrier metal layer 15, the bonding layer 73, the second barrier metal layer 72, and the support substrate 71. Thus, light is emitted from the light emitting layer 30.

In this example, the semiconductor light emitting device 110 further includes a protective layer 80. The protective layer 80 covers the side surface and part of the upper surface of the nitride semiconductor layer 10s.

The protective layer 80 is made of e.g. an insulating material such as $SiO_2$ and SiN. The protective layer 80 is provided on e.g. the sidewall and the outer peripheral portion of the nitride semiconductor layer 10s except the light extraction surface. The protective layer 80 protects the side surface of the nitride semiconductor layer 10s. In this example, the protective layer 80 is formed also on part of the upper surface of the p-side electrode 20e. The protective layer 80 thus provided can suppress short circuit due to e.g. foreign matter attached in the manufacturing process.

In this example, the semiconductor light emitting device 110 further includes a translucent layer 85. The translucent layer 85 is provided on e.g. the surface unevenness 10u of the first semiconductor layer 10. The refractive index of the translucent layer 85 is lower than the refractive index of the first semiconductor layer 10. The refractive index of the translucent layer 85 is e.g. 1.6 or more and 2.5 or less. The thickness of the translucent layer 85 is e.g. 50 nm or more and 200 nm or less. The transmittance of the translucent layer 85 for the light emitted from the light emitting layer 30 is e.g. 90% or more. The translucent layer 85 functions as e.g. a refractive index adjustment layer. This increases the light extraction efficiency.

In the following, one example of the method for manufacturing a semiconductor light emitting device according to the embodiment is described. In the example described below, a plurality of semiconductor light emitting devices 110 are fabricated from one first substrate 50.

Figure 3:
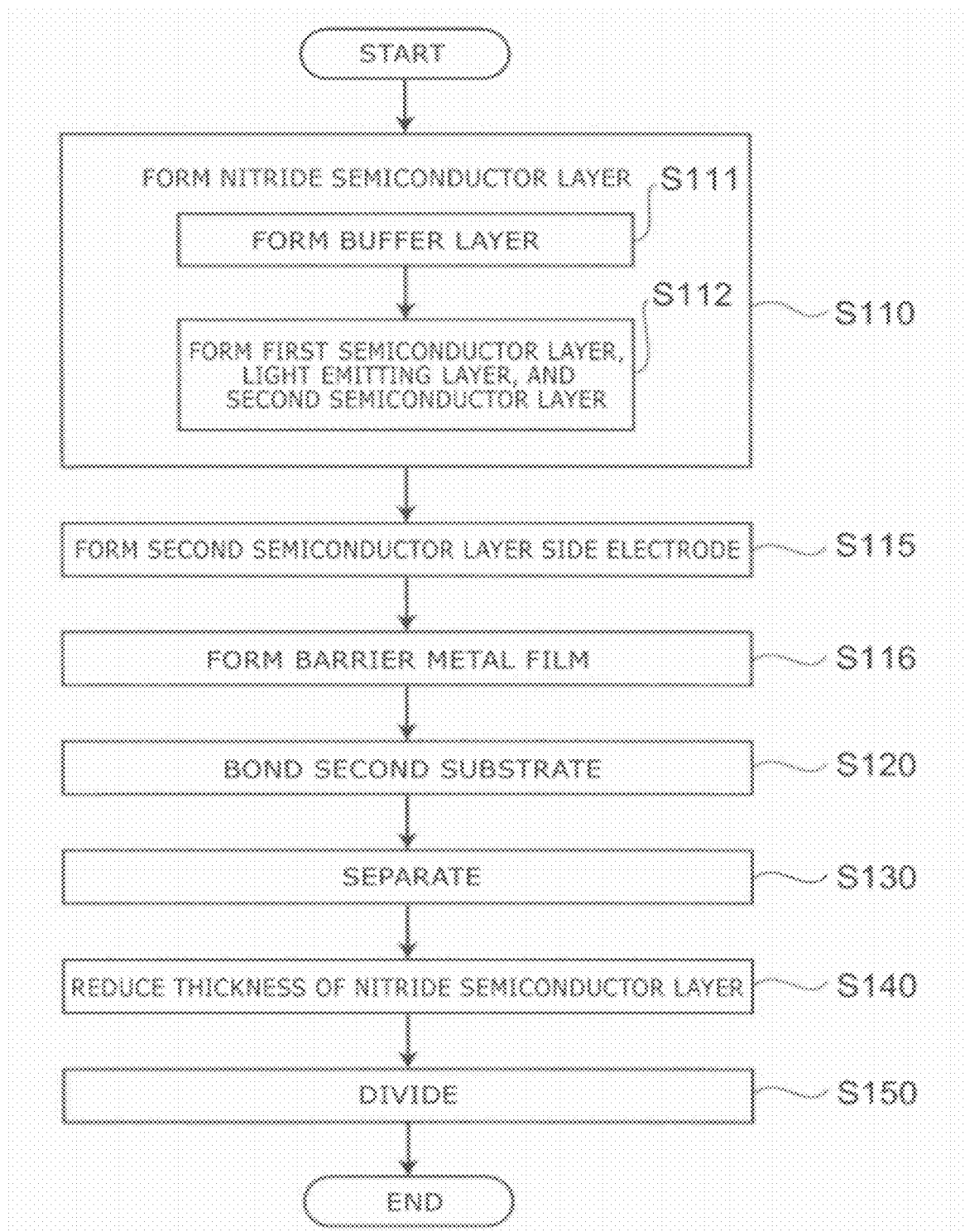
FIG. 3 is a flow chart illustrating the method for manufacturing a semiconductor light emitting device according to the first embodiment.

FIG. 3 is a flow chart illustrating the method for manufacturing a semiconductor light emitting device according to the first embodiment.

FIGS. 4A to 4D, 5A to 5C, 6A to 6C, and 7A to 7C are sequential schematic sectional views illustrating the method for manufacturing a semiconductor light emitting device according to the first embodiment.

As shown in FIG. 3, the method for manufacturing a semiconductor light emitting device according to the embodiment includes a step for forming a nitride semiconductor layer 10s on the major surface 50a of a first substrate 50 (step S110). The first substrate 50 has a major surface 50a provided with an unevenness 50u. The nitride semiconductor layer 10s includes a light emitting layer 30.

Figure 4A:
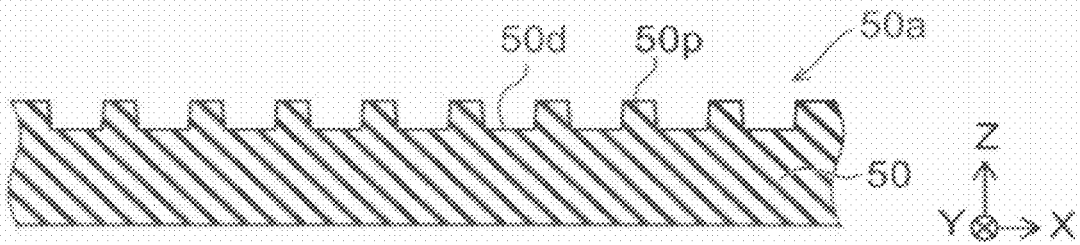
FIGS. 4A to 4D, 5A to 5C, 6A to 6C, and 7A to 7C are sequential schematic sectional views illustrating the method for manufacturing a semiconductor light emitting device according to the first embodiment.

More specifically, as shown in FIG. 4A, the major surface 50a of the first substrate 50 is provided with an unevenness 50u. The first substrate 50 is made of e.g. sapphire or SiC.

On the major surface 50a of the first substrate 50, a crystal of the nitride semiconductor layer 10s is grown. This growth is based on e.g. the metal organic chemical vapor deposition (MOCVD) method. However, the embodiment is not limited thereto. The method for forming the nitride semiconductor layer 10s is arbitrary.

Figure 4B:
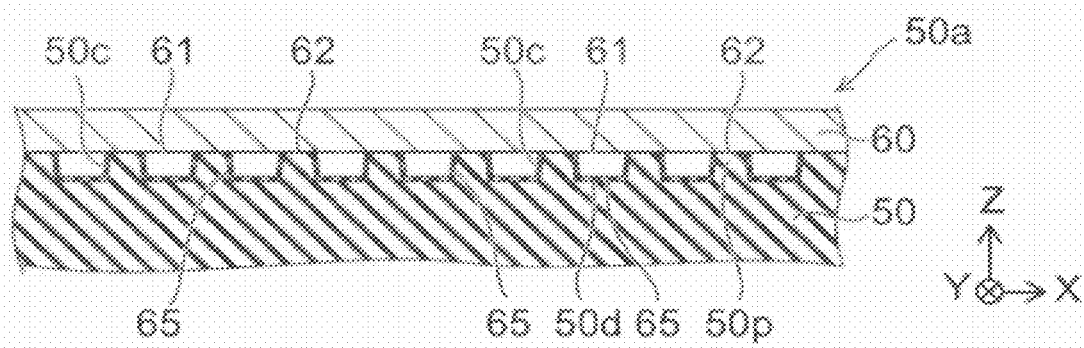

As shown in FIG. 4B, on the major surface 50a, a buffer layer 60 constituting part of the nitride semiconductor layer 10s is formed. The buffer layer 60 includes a nitride semiconductor. The buffer layer 60 is made of e.g. GaN. The thickness of the buffer layer 60 is e.g. 0.5 μm or more and 5 μm or less.

The step for forming the nitride semiconductor layer 10s (e.g., buffer layer 60) includes leaving a cavity 50c in the space inside the depression 50d while forming a thin film 65 on the inner wall surface of the depression 50d of the unevenness 50u. The thin film 65 includes the same material as at least part of the nitride semiconductor layer 10s (e.g., buffer layer 60). The portion of the buffer layer 60 facing the depression 50d constitutes a first portion 61. The portion of the buffer layer 60 facing the protrusion 50p constitutes a second portion 62. The second portion 62 is in contact with the protrusion 50p.

Figure 4C:
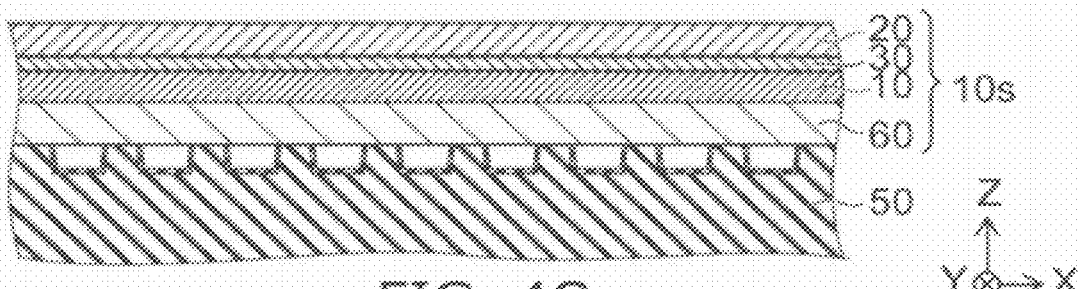

As shown in FIG. 4C, a first semiconductor layer 10 is formed on the buffer layer 60. A light emitting layer 30 is formed on the first semiconductor layer 10. A second semiconductor layer 20 is formed on the light emitting layer 30. The nitride semiconductor layer 10s includes the buffer layer 60, the first semiconductor layer 10, the light emitting layer 30, and the second semiconductor layer 20.

That is, as shown in FIG. 3, the formation of the nitride semiconductor layer 10s (step S110) includes forming a buffer layer 60 on the first substrate 50 (step S111), and forming a first semiconductor layer 10 on the buffer layer 60, forming a light emitting layer 30 on the first semiconductor layer 10, and forming a second semiconductor layer 20 on the light emitting layer 30 (step S112).

Specifically, as the first semiconductor layer 10, for instance, a first n-type layer 10a and a second n-type layer 10b are formed. The growth temperature of the first semiconductor layer 10 is e.g. approximately 1000° C. or more and approximately 1100° C. or less.

Subsequently, a barrier layer and a well layer constituting the light emitting layer 30 are formed. The growth temperature of the light emitting layer 30 is e.g. approximately 700° C. or more and approximately 900° C. or less.

On the light emitting layer 30, for instance, a third p-type layer 20c, a second p-type layer 20b, and a first p-type layer 20a constituting the second semiconductor layer 20 are formed. The growth temperature of the second semiconductor layer 20 is e.g. approximately 1000° C. or more and approximately 1100° C. or less.

As shown in FIG. 3, on at least part of the second semiconductor layer 20, a second semiconductor layer side electrode (e.g., p-side electrode 20e) is formed (step S115).

Figure 4D:
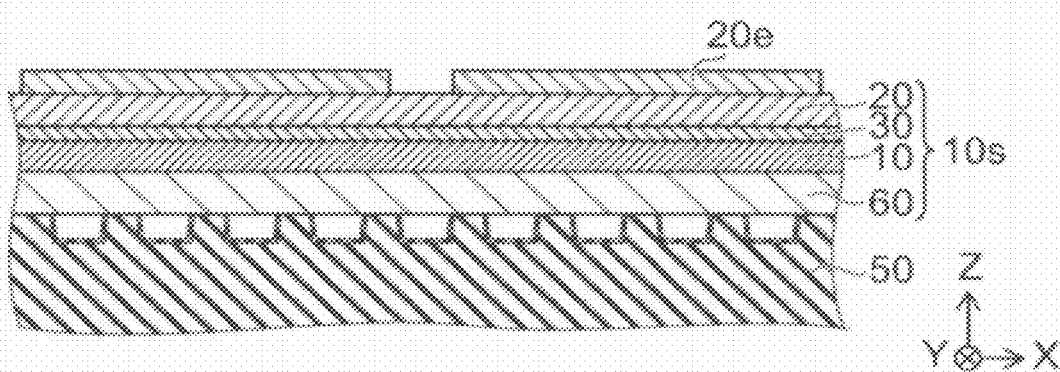

In this example, as shown in FIG. 4D, a p-side electrode 20e is formed on part of the second semiconductor layer 20. For instance, as a p-side electrode 20e, a Ni layer is formed on the second semiconductor layer 20, and an Ag layer is formed on the Ni layer. The Ni layer and the Ag layer are formed by e.g. evaporation.

As shown in FIG. 3, on the second semiconductor layer side electrode, a barrier metal film (e.g., first barrier metal layer 15) is formed (step S116).

Figure 5A:
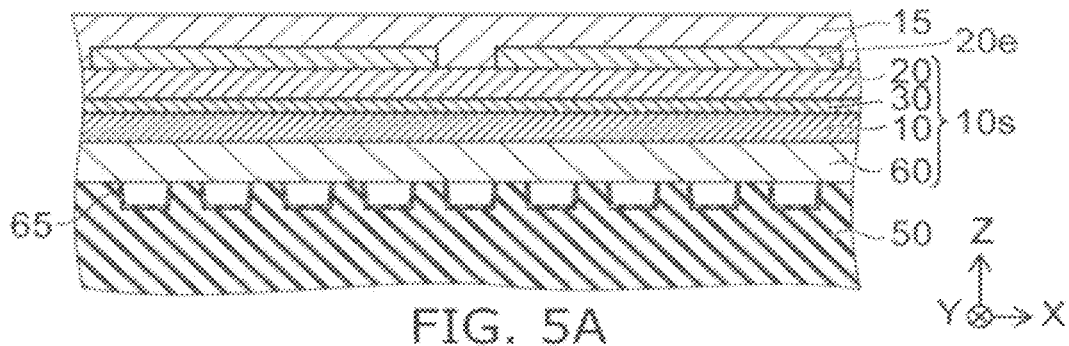

Specifically, as shown in FIG. 5A, a first barrier metal layer 15 is formed on the p-side electrode 20e and on the second semiconductor layer 20. For instance, as a first barrier metal layer 15, a Ti layer (third layer 15c) is formed, a Pt layer (second layer 15b) is formed on the Ti layer, and an Au layer (first layer 15a) is formed on the Pt layer.

As shown in FIG. 3, the manufacturing method can further include a step for bonding the nitride semiconductor layer 10s to a second substrate 70 (step S120).

Figure 5B:
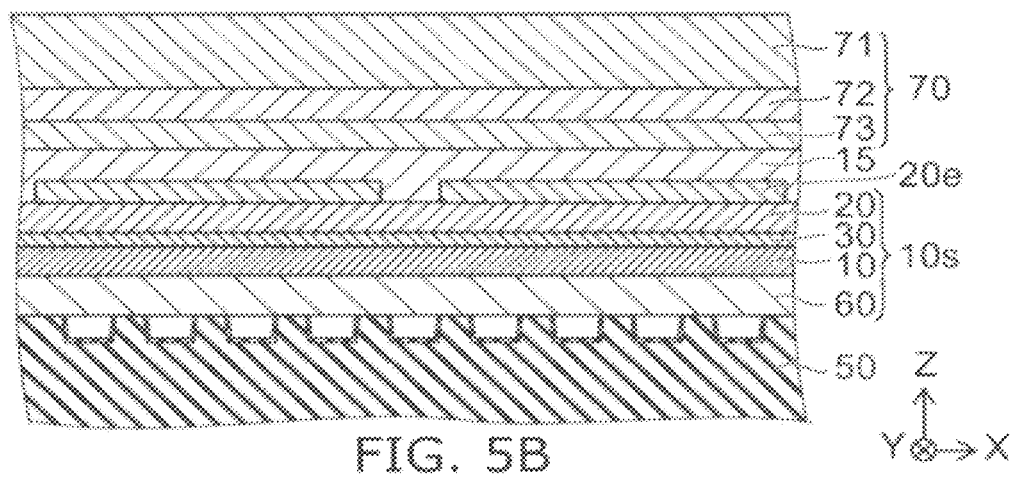

As shown in FIG. 5B, in the specific example, the second substrate 70 includes a support substrate 71, a bonding layer 73, and a second barrier metal layer 72.

As shown in FIG. 5B, the bonding layer 73 of this second substrate 70 is brought into contact with the first barrier metal layer 15 and heated while applying a load on the first substrate 50 and the second substrate 70. The load is e.g. 500 newtons (N) or more and 1000 N or less. The heating temperature is e.g. 280° C. or more and 350° C. or less. Thus, the nitride semiconductor layer 10s and the second substrate 70 are bonded.

In the embodiment, the thickness of the bonding layer 73 is preferably e.g. 2 μm or more. If the thickness of the bonding layer 73 is less than 2 μm, there may be cases where a sufficient bonding strength cannot be achieved depending on the bonding condition. Insufficient bonding strength may cause failure in the subsequent steps, or failure in the semiconductor light emitting device.

In this example, the p-side electrode 20e and the first barrier metal layer 15 are included in the intermediate layer 75 illustrated in FIG. 1A. In the case where the second substrate 70 includes the support substrate 71 with the second barrier metal layer 72 and the bonding layer 73 provided separately from the second substrate 70, the second barrier metal layer 72 and the bonding layer 73 are further included in the intermediate layer 75.

As shown in FIG. 3, the manufacturing method further includes a step for separating the first substrate 50 from the nitride semiconductor layer 10s by irradiating the nitride semiconductor layer 10s with light Lr via the first substrate 50 (step S130).

Figure 5C:
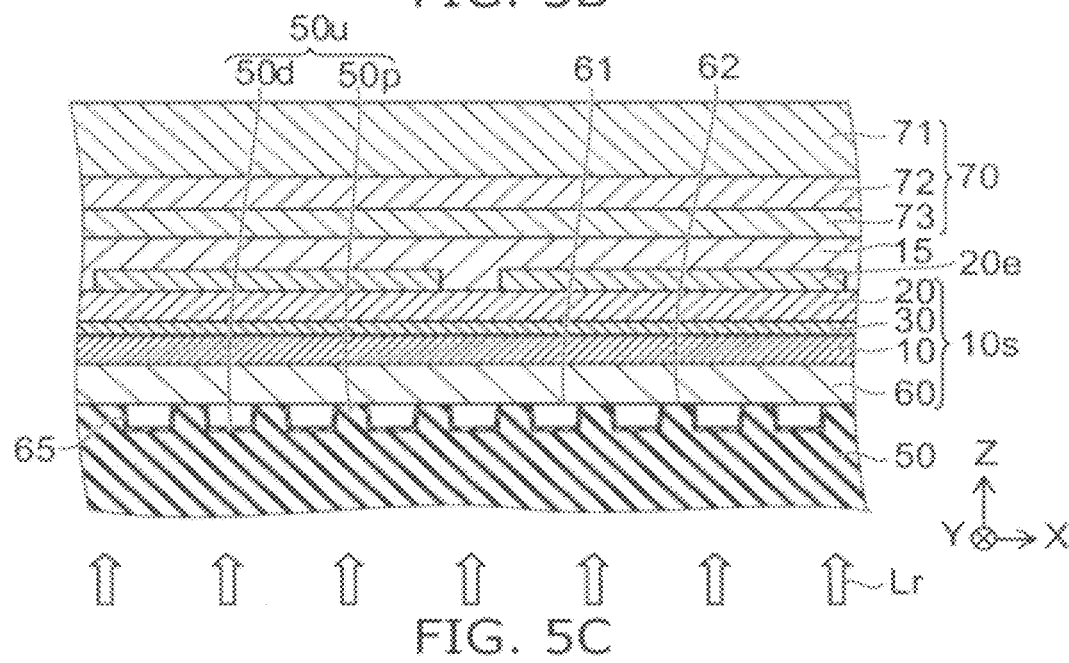

More specifically, as shown in FIG. 5C, light Lr is applied to the surface of the first substrate 50 opposite to the nitride semiconductor layer 10s. Thus, the first substrate 50 is separated from the nitride semiconductor layer 10s.

This separating step includes causing the thin film 65 to absorb at least part of the light Lr so that the intensity of light applied to the portion (first portion 61) of the nitride semiconductor layer 10s facing the depression 50d is made lower than the intensity of light applied to the portion (second portion 62) of the nitride semiconductor layer 10s facing the protrusion 50p.

For irradiation with light Lr, for instance, a KrF laser is used. The irradiation power density of the light Lr is e.g. 0.65 joules/square centimeter ($J/cm^2$) or more and 0.80 $J/cm^2$ or less. However, the appropriate irradiation power density of the light Lr is optimally adjusted depending on e.g. the area of the nitride semiconductor layer 10s, the in-plane intensity distribution of the laser beam, and the area of the laser beam.

Figure 6A:
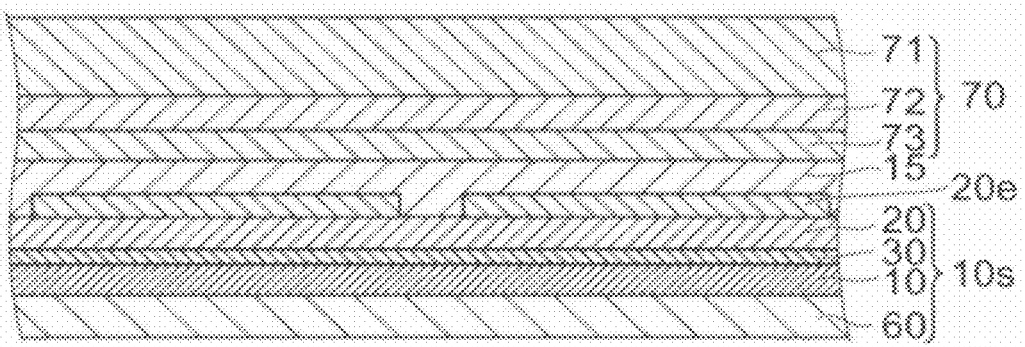

As shown in FIG. 6A, the first substrate 50 is separated from the nitride semiconductor layer 10s. In the embodiment, the intensity of light applied to the first portion 61 of the nitride semiconductor layer 10s is made lower. This suppresses damage to the nitride semiconductor layer 10s. That is, damage to the semiconductor layer in removing the growth substrate can be suppressed.

Subsequently, the following steps, for instance, for fabricating a semiconductor light emitting device are performed.

Figure 6B:
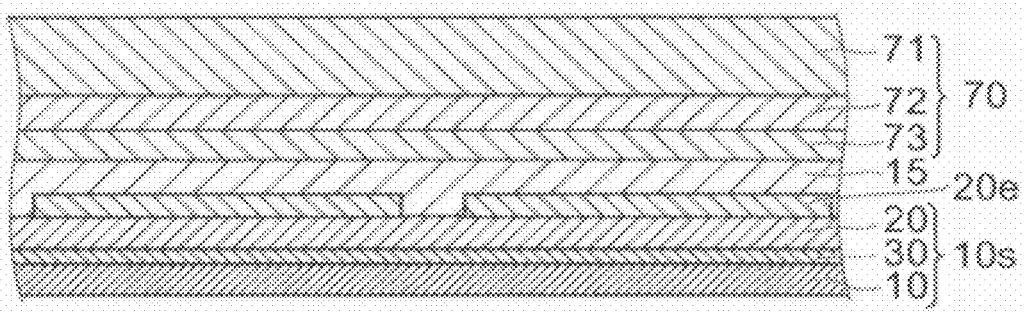

For instance, as shown in FIG. 6B, the buffer layer 60 is polished to expose the first semiconductor layer 10.

More specifically, as shown in FIG. 3, after the above separating step (step S130), the manufacturing method according to the embodiment can further include a step for reducing the thickness of the nitride semiconductor layer 10s (step S140). Thus, the nitride semiconductor layer 10s becomes a stacked body of the first semiconductor layer 10, the light emitting layer 30, and the second semiconductor layer 20. By performing this polishing step, the flatness of the surface of the workpiece is improved.

Figure 6C:
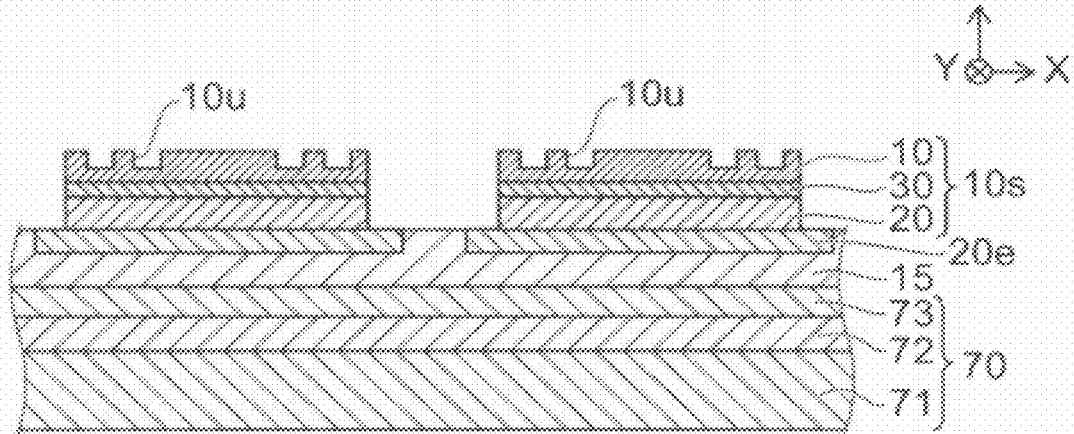

Subsequently, as shown in FIGS. 3 and 6C, the nitride semiconductor layer 10s is divided in dimensions for each semiconductor light emitting device (step S150). The example of FIG. 6C illustrates portions corresponding to two semiconductor light emitting devices. Here, FIG. 6C is depicted by vertically reversing the state shown in FIG. 6B.

Furthermore, a surface unevenness 10u is formed at the surface of the first semiconductor layer 10 (the surface of the first semiconductor layer 10 opposite to the light emitting layer 30). The surface unevenness 10u is formed by treatment with e.g. a strong alkaline aqueous solution. The strong alkaline aqueous solution is e.g. an aqueous solution including at least one of potassium hydroxide and sodium hydroxide. The temperature of this treatment is e.g. 60° C. or more and 80° C. or less.

Figure 7A:
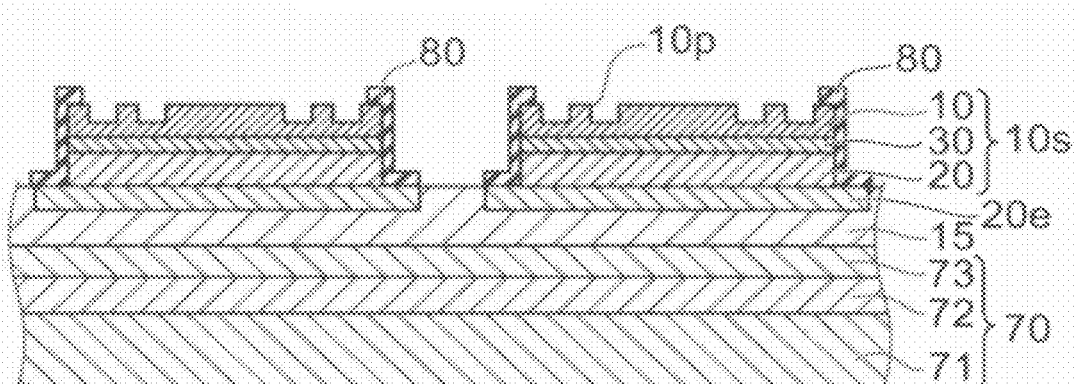

As shown in FIG. 7A, a protective layer 80 covering the side surface and part of the upper surface of the nitride semiconductor layer 10s is formed.

Figure 7B:
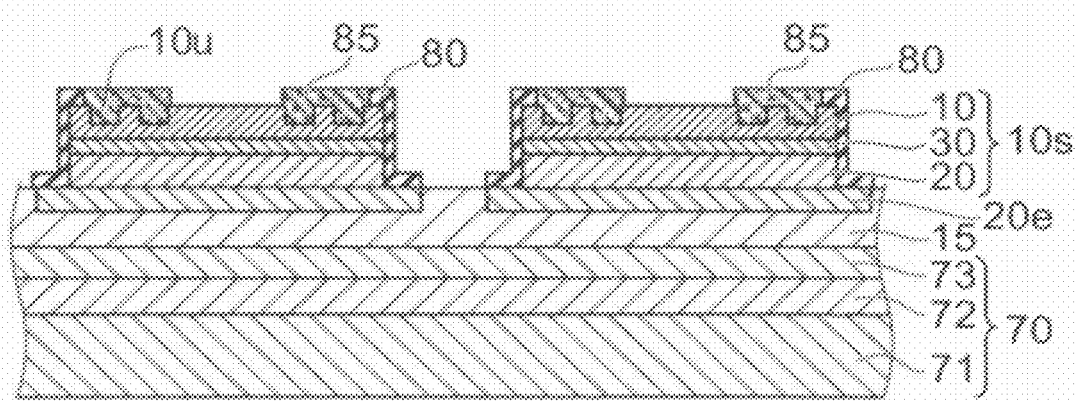

As shown in FIG. 7B, a translucent layer 85 is formed on the surface unevenness 10u of the first semiconductor layer 10.

Figure 7C:
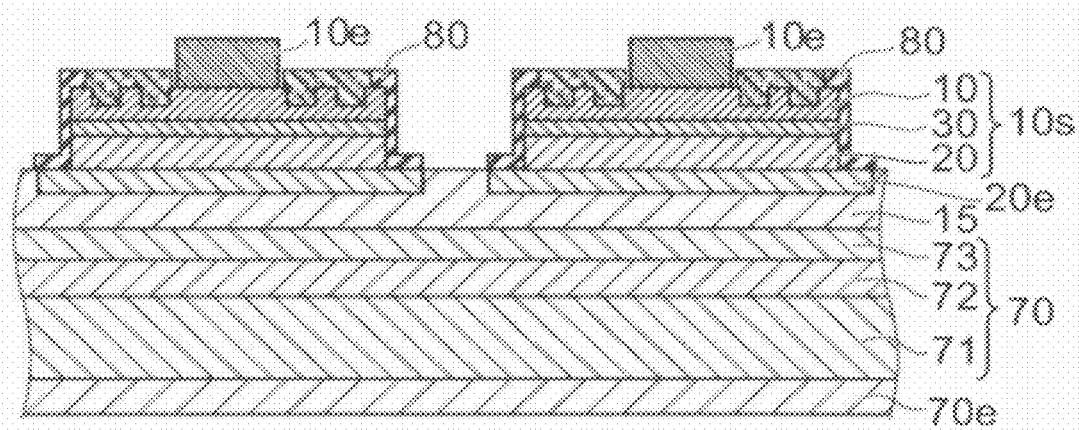

As shown in FIG. 7C, an n-side electrode 10e is formed on the region of the first semiconductor layer 10 where the translucent layer 85 is not provided. A second substrate electrode 70e is formed on the surface of the second substrate 70 opposite to the nitride semiconductor layer 10s.

Subsequently, the second substrate 70 (as well as the first barrier metal layer 15) is divided in the region between the semiconductor light emitting devices. In this singulation (chip formation) step, methods such as laser scribing and laser dicing can be used.

Thus, the semiconductor light emitting device 110 is fabricated.

Figure 8:
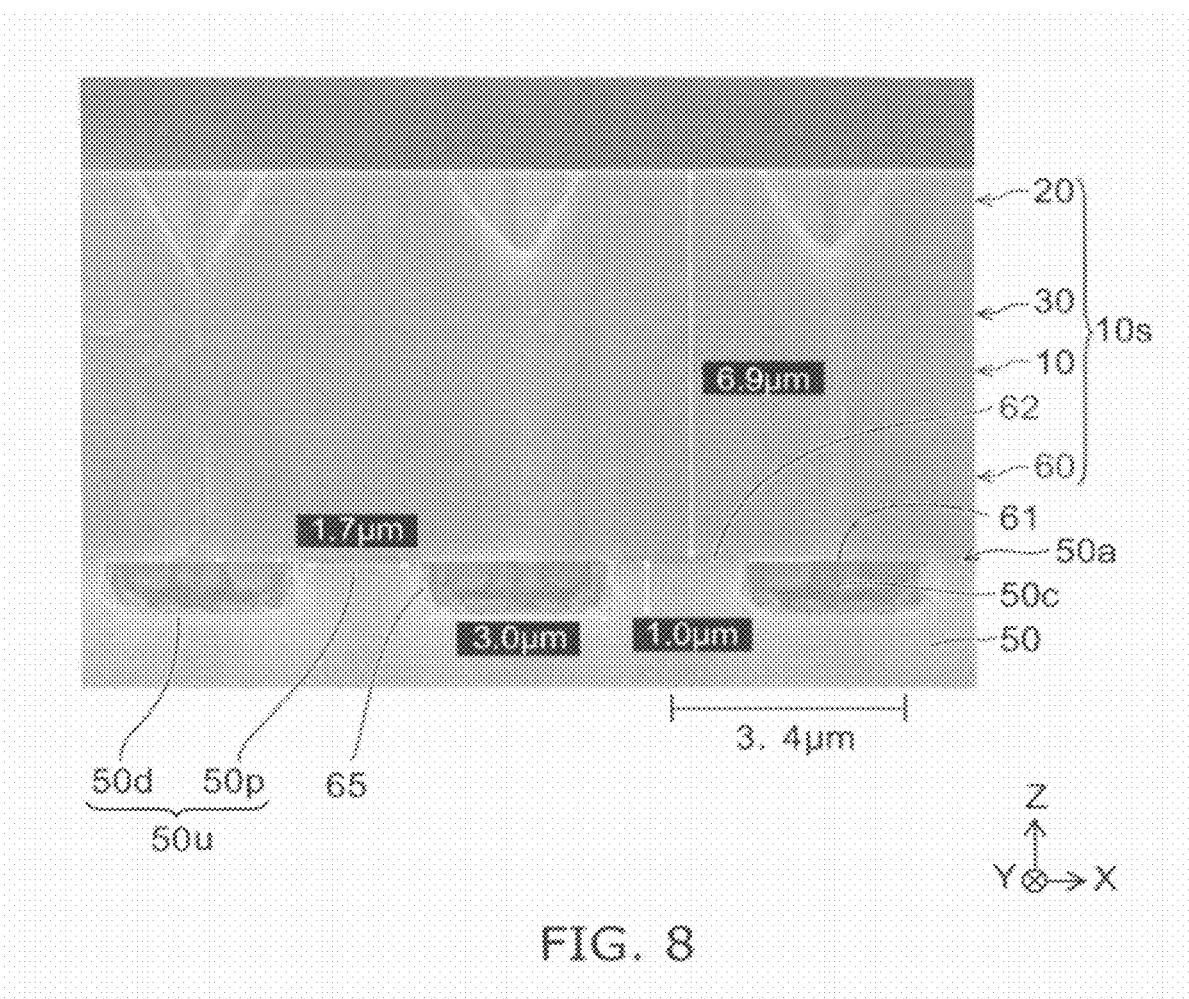
FIG. 8 is an electron micrograph image illustrating the method for manufacturing a semiconductor light emitting device according to the first embodiment.

FIG. 8 is an electron micrograph image illustrating the method for manufacturing a semiconductor light emitting device according to the first embodiment.

More specifically, this figure is a scanning electron micrograph (SEM) image of a cross section of the first substrate 50 and the nitride semiconductor layer 10s midway during the process for manufacturing the semiconductor light emitting device 110.

This example shows a cross-sectional SEM micrograph of the state (e.g., the state of FIG. 4C) after the buffer layer 60, the first semiconductor layer 10, the light emitting layer 30, and the second semiconductor layer 20 are sequentially formed on the major surface 50a of the first substrate 50.

As seen from FIG. 8, a thin film 65 is formed on the inner wall surface of the depression 50d of the unevenness 50u of the first substrate 50. This thin film 65 includes the same material as at least part (specifically, the buffer layer 60) of the nitride semiconductor layer 10s. A cavity 50c is left in the space inside the depression 50d.

The lower surface of the portion (first portion 61) of the nitride semiconductor layer 10s facing the depression 50d of the first substrate 50 is flat and parallel to the major surface 50a. Thus, in the embodiment, the step for forming the nitride semiconductor layer 10s (step S110) includes causing at least part of the lower surface of the portion (first portion 61) of the nitride semiconductor layer 10s facing the depression 50d to be parallel to the major surface 50a of the substrate 50.

Thus, the lower surface of the portion (first portion 61) facing the depression 50d is made parallel to the major surface 50a. Hence, the flatness of the surface of the nitride semiconductor layer 10s after separation of the first substrate 50 is improved. This facilitates flattening (e.g., the polishing step) of the nitride semiconductor layer 10s.

The position along the Z-axis of the lower surface of the first portion 61 is substantially equal to the position along the Z-axis of the lower surface of the second portion 62. That is, in the step for forming the nitride semiconductor layer 10s (step S110), the position along the Z-axis (the axis perpendicular to the major surface 50a) of the lower surface of the portion (first portion 61) of the nitride semiconductor layer 10s facing the depression 50d is made substantially equal to the position along the Z-axis of the lower surface of the portion (second portion 62) of the nitride semiconductor layer 10s facing the protrusion 50p.

Thus, as viewed from the first substrate 50, the height of the first portion 61 is made equal to the height of the second portion 62. Hence, for instance, the flatness of the surface of the nitride semiconductor layer 10s is improved, which facilitates e.g. the polishing step.

In the semiconductor light emitting device 110 manufactured by the manufacturing method according to the embodiment, damage to the semiconductor layer in removing the growth substrate is suppressed. Thus, for instance, high light emission efficiency is achieved, and the reliability is improved.

FIGS. 9A to 9D, and 10A to 10C are sequential schematic sectional views illustrating a method for manufacturing a semiconductor light emitting device of a reference example.

Figure 9A:
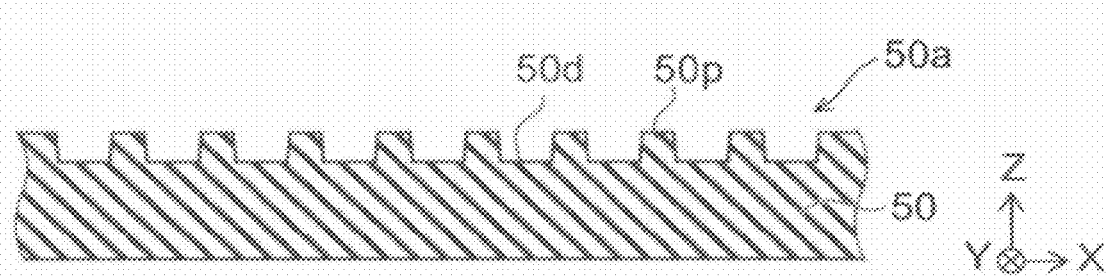
FIGS. 9A to 9D, and 10A to 10C are sequential schematic sectional views illustrating a method for manufacturing a semiconductor light emitting device of a reference example.

As shown in FIG. 9A, the manufacturing method of the reference example also uses a first substrate 50 having a major surface 50a provided with an unevenness 50u.

Figure 9B:
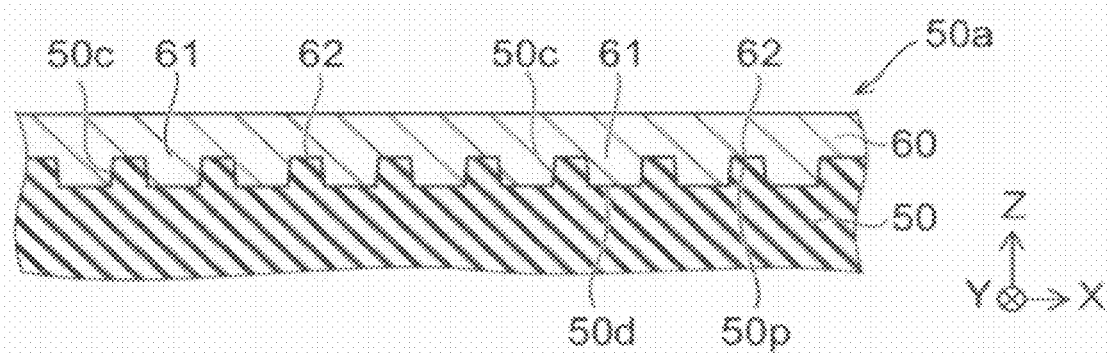
Figure 9C:
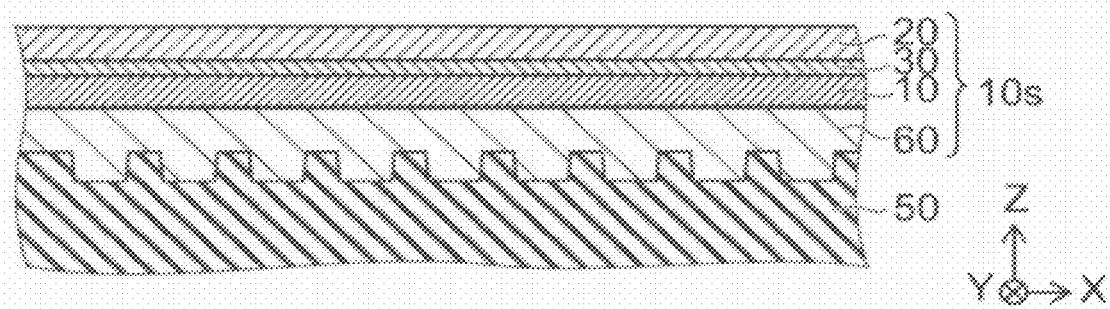
Figure 9D:
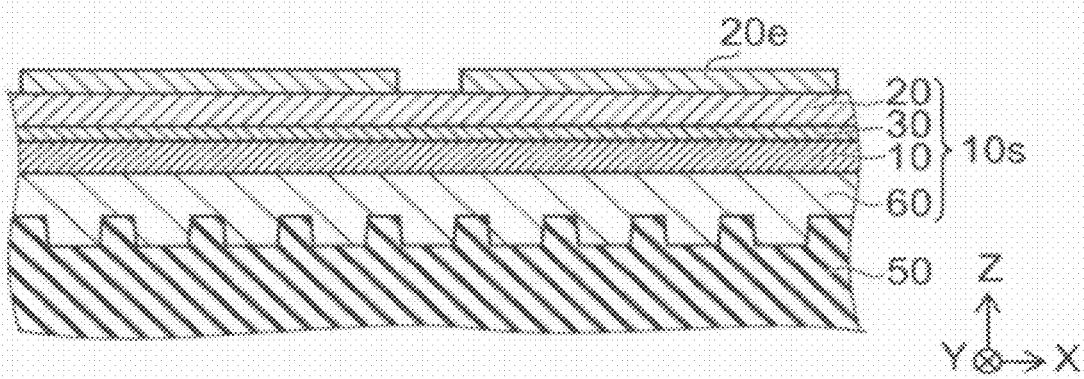

As shown in FIG. 9B, a buffer layer 60 is formed on the major surface 50a. In the reference example, the inside of the depression 50d of the first substrate 50 is filled with the same material as the buffer layer 60. Thus, the cavity 50c (as well as the thin film 65) is not substantially formed. That is, in the buffer layer 60, in addition to the second portion 62 facing the protrusion 50p, the first portion 61 facing the depression 50d is also in contact with the substrate 50.

Subsequently, as shown in FIGS. 9C, 9D, 10A, and 10B, a first semiconductor layer 10, a light emitting layer 30, a second semiconductor layer 20, a p-side electrode 20e, and a first barrier metal layer 15 are formed and bonded to a second substrate 70.

Figure 10A:
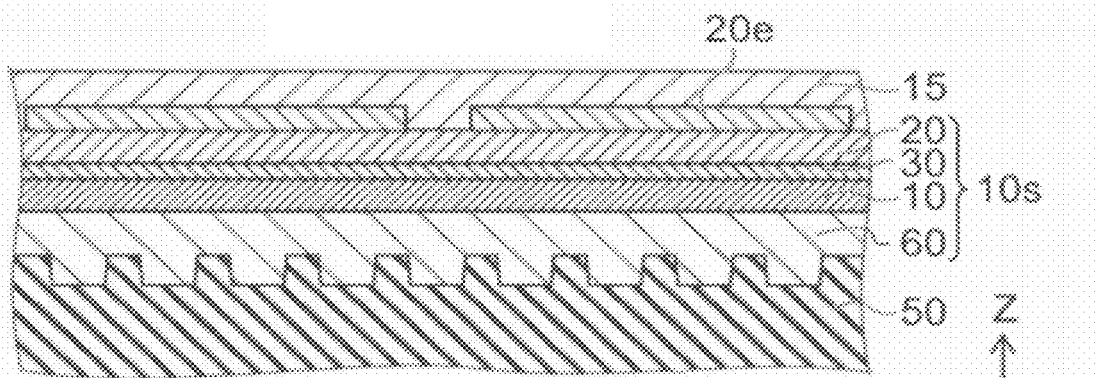
Figure 10B:
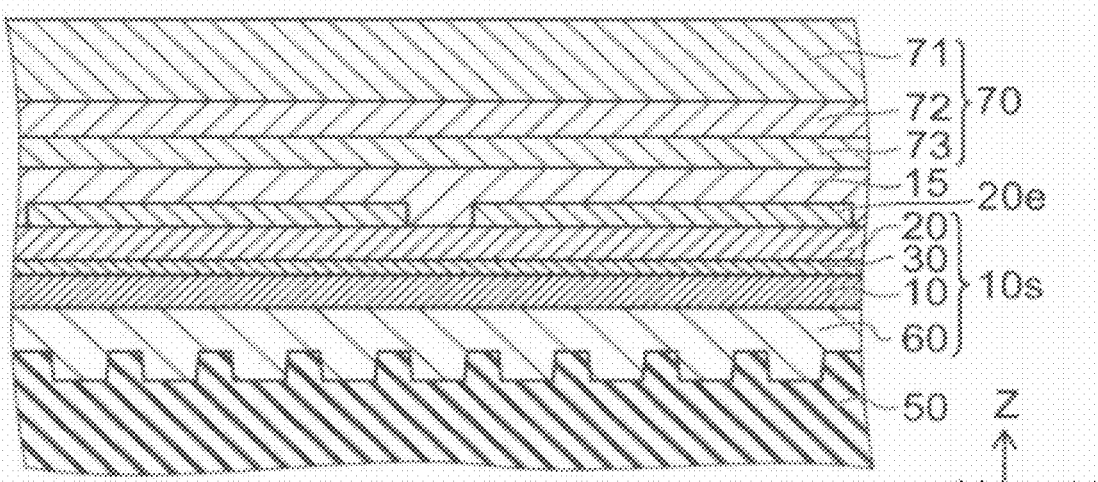
Figure 10C:
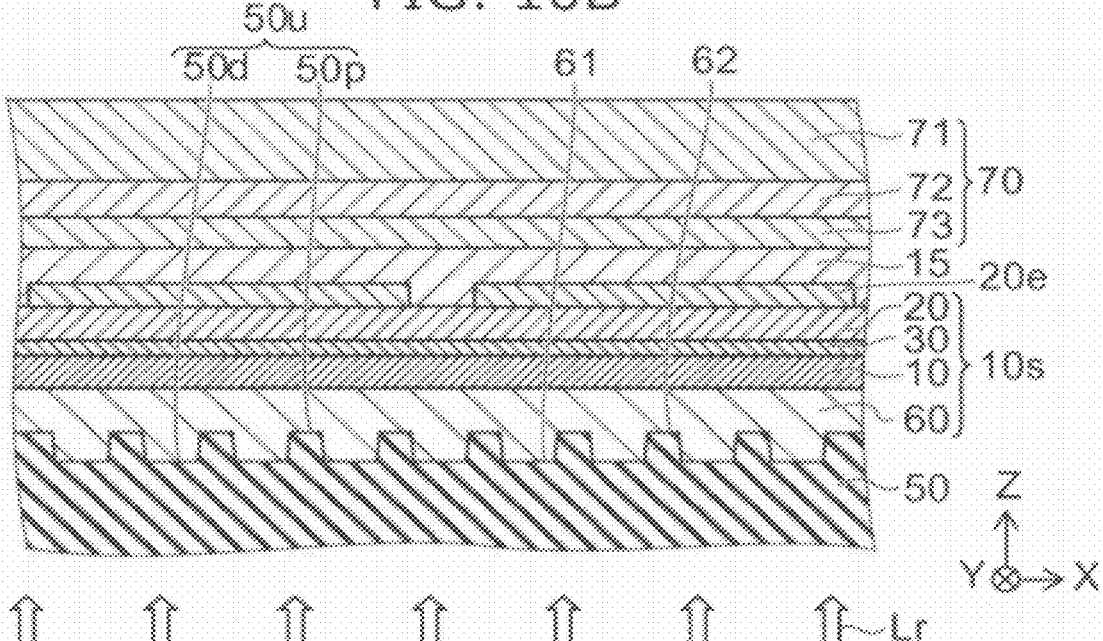

Then, as shown in FIG. 10C, light Lr is applied to separate the first substrate 50 from the nitride semiconductor layer 10s (buffer layer 60). At this time, the first portion 61 and the second portion 62 of the buffer layer 60 are in contact with the first substrate 50. Hence, the first substrate 50 is not easily removed from the buffer layer 60. Thus, the intensity of light Lr required for separation is high. Hence, the nitride semiconductor layer 10s is more prone to damage. Furthermore, the thin film 65 (as well as the cavity 50c) is not provided in the depression 50d. Hence, the intensity of light applied to the first portion 61 is high. That is, both the first portion 61 and the second portion 62 of the nitride semiconductor layer 10s are damaged.

Subsequently, by a process similar to that of the embodiment, the semiconductor light emitting device of the reference example is obtained. In the semiconductor light emitting device of the reference example, the damage to the nitride semiconductor layer 10s is greater. Hence, for instance, the light emission efficiency is low, and the reliability is low.

In contrast, the manufacturing method according to the embodiment suppresses damage to the semiconductor layer in removing the growth substrate. Thus, for instance, a semiconductor light emitting device with high light emission efficiency and improved reliability is achieved.

As an alternative reference example, the nitride semiconductor layer 10s can be formed on a substrate with no unevenness 50u. In this reference example, the dislocation density in the nitride semiconductor layer 10s is high. In contrast, in the manufacturing method according to the embodiment, the nitride semiconductor layer 10s is formed on the major surface 50a of the first substrate 50 having an unevenness 50u. This reduces the dislocation density. According to the embodiment, a high quality crystal can be grown. Thus, high efficiency is achieved.

Figure 11:
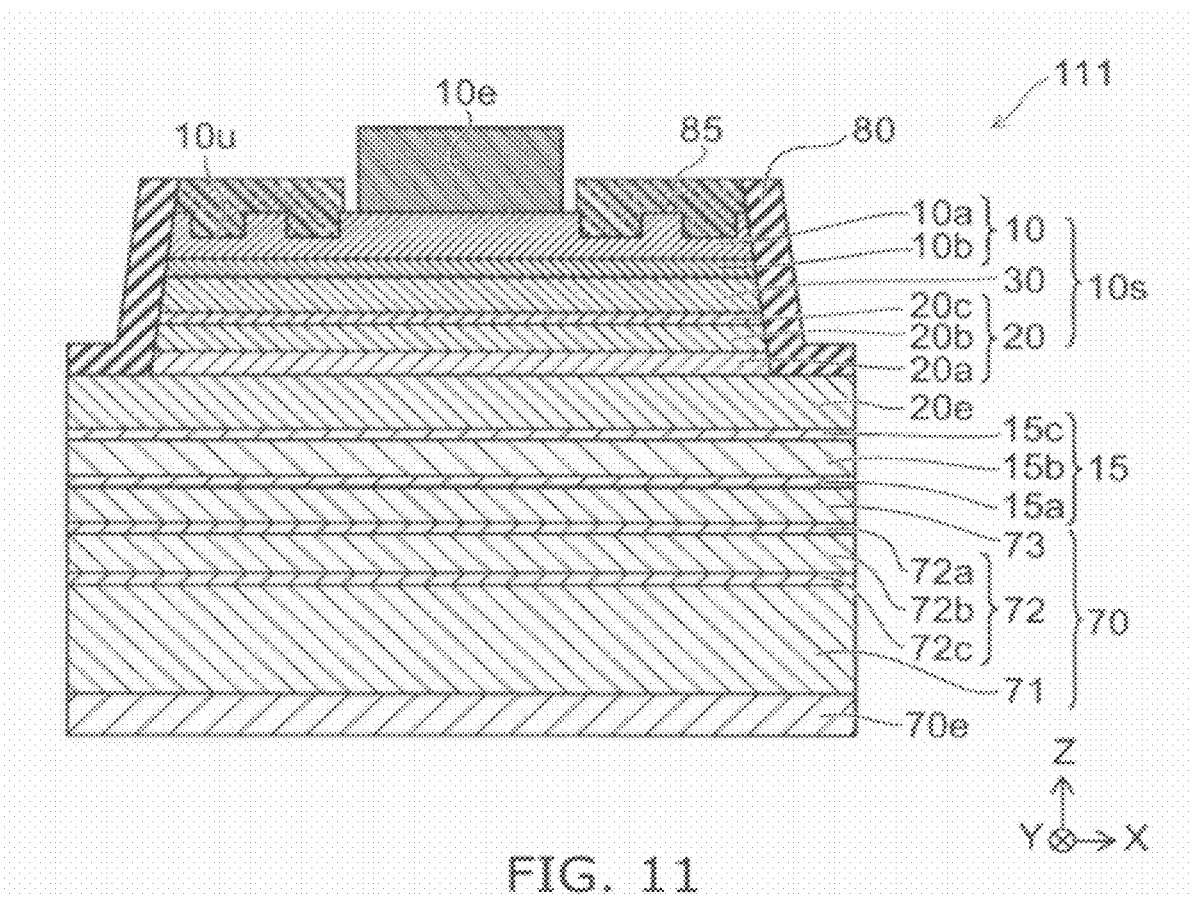
FIG. 11 is a schematic sectional view illustrating an alternative semiconductor light emitting device manufactured by the method for manufacturing a semiconductor light emitting device according to the first embodiment.

FIG. 11 is a schematic sectional view illustrating the configuration of an alternative semiconductor light emitting device manufactured by the method for manufacturing a semiconductor light emitting device according to the first embodiment.

As shown in FIG. 11, in the alternative semiconductor light emitting device 111 manufactured by the manufacturing method according to the embodiment, the side surface of the nitride semiconductor layer 10s is sloped. For instance, in the step described with reference to FIG. 6C, the nitride semiconductor layer 10s is tapered. This tapered shape can be obtained by appropriately controlling the processing condition for the nitride semiconductor layer 10s.

Thus, the manufacturing method according to the embodiment can be variously modified.

Figure 12A:
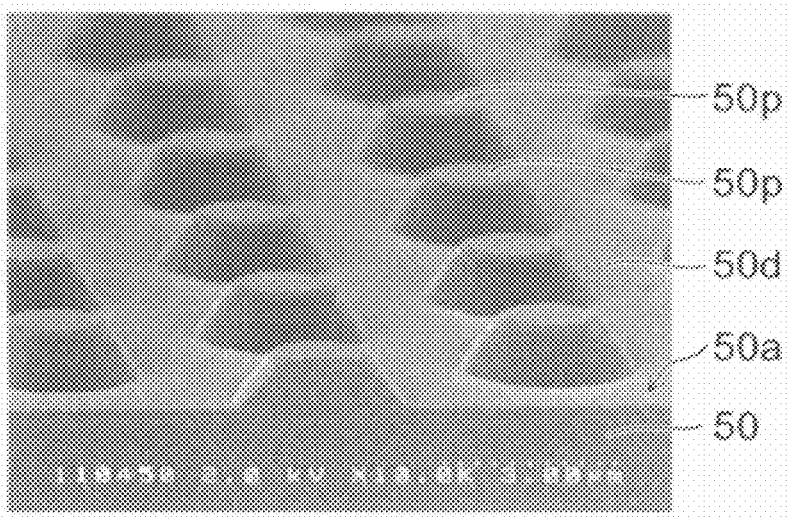
FIGS. 12A to 12C are schematic views illustrating members used in the method for manufacturing a semiconductor light emitting device according to the first embodiment.
Figure 12B:
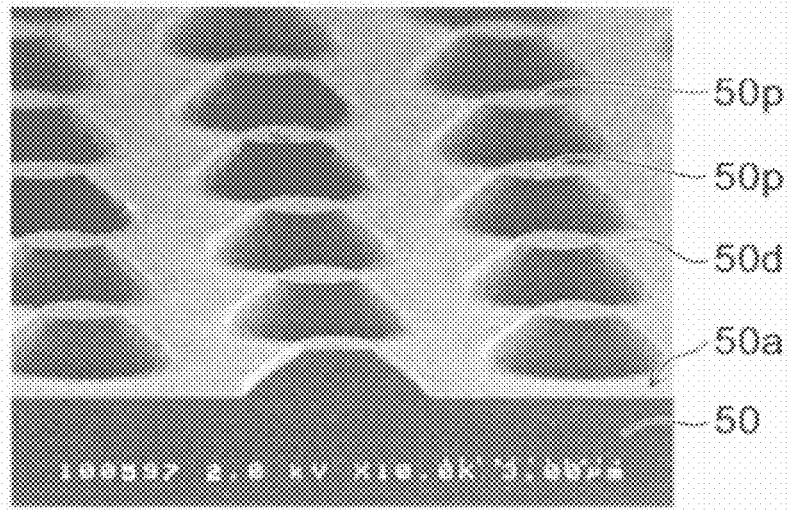
Figure 12C:
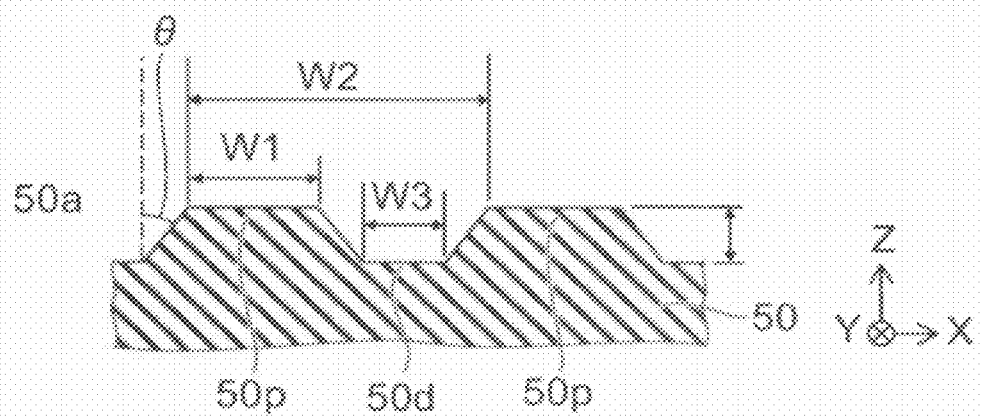

FIGS. 12A to 12C are schematic views illustrating members used in the method for manufacturing a semiconductor light emitting device according to the first embodiment.

FIGS. 12A and 12B are scanning electron micrograph images illustrating alternative first substrates 50 used in the manufacturing method according to the embodiment. FIG. 12C is a schematic sectional view illustrating the configuration of the first substrate 50 of this example.

As shown in FIGS. 12A and 12B, at the major surface 50a of the first substrate 50 used in this manufacturing method, a continuous depression 50d and a plurality of protrusions 50p are provided. In this case, as viewed along the axis perpendicular to the major surface 50a, the depression 50d surrounds each of the plurality of protrusions 50p. In this example, the planar shape of the protrusion 50p is circular. However, in the embodiment, the planar shape is arbitrary.

As shown in FIG. 12C, the upper surface of the protrusion 50p has a first width W1. The pitch along the axis perpendicular to the Z-axis of two adjacent protrusions 50p is a second width W2. The width of the depression 50d along the axis connecting the centers of two adjacent protrusions 50p is a third width W3. The angle between the axis (Z-axis) perpendicular to the major surface 50a of the first substrate 50 and the slope of the protrusion 50p is a slope angle $\theta$.

In the example shown in FIG. 12A, the first width W1 is approximately 1 µm. The second width W2 is approximately 5 µm. The third width W3 is approximately 1.8 µm. The slope angle $\theta$ is approximately 30 degrees.

In the example shown in FIG. 12B, the first width W1 is approximately 1.4 µm. The second width W2 is approximately 5 µm. The third width W3 is approximately 1.9 µm. The slope angle $\theta$ is approximately 40 degrees.

In the embodiment, the area of the portion (second portion 62) of the nitride semiconductor layer 10s facing the protrusion 50p is preferably smaller than the area of the portion (first portion 61) of the nitride semiconductor layer 10s facing the depression 50d. The second portion 62 is a portion in contact with the first substrate 50. The first portion 61 is a portion separated from the first substrate 50. By making the area of the second portion 62 smaller than the area of the first portion 61, the first substrate 50 is easily separated from the nitride semiconductor layer 10s. This further suppresses damage to the semiconductor layer in removing the growth substrate.

In the case where the first substrate 50 includes a plurality of depressions 50d, and in the case where the first substrate 50 includes a plurality of protrusions 50p, at least one of the width along a second axis (e.g., X-axis or Y-axis) parallel to the major surface 50a of the top of the protrusion 50p and the width along the second axis of the bottom of the depression 50d is preferably 0.5 µm or more and 3 µm or less. Then, when the nitride semiconductor layer 10s (e.g., buffer layer 60) is formed on the major surface 50a of the first substrate 50, the cavity 50c can be stably formed.

In the first substrate 50, the average angle between the Z-axis perpendicular to the major surface 50a and the side surface of the unevenness 50u is preferably 20 degrees or more. Then, the cavity 50c can be stably formed while forming the thin film 65. Here, the side surface of the unevenness 50u is e.g. the side surface of the protrusion 50p. Alternatively, the side surface of the unevenness 50u is the side surface of the depression 50d.

Figure 13:
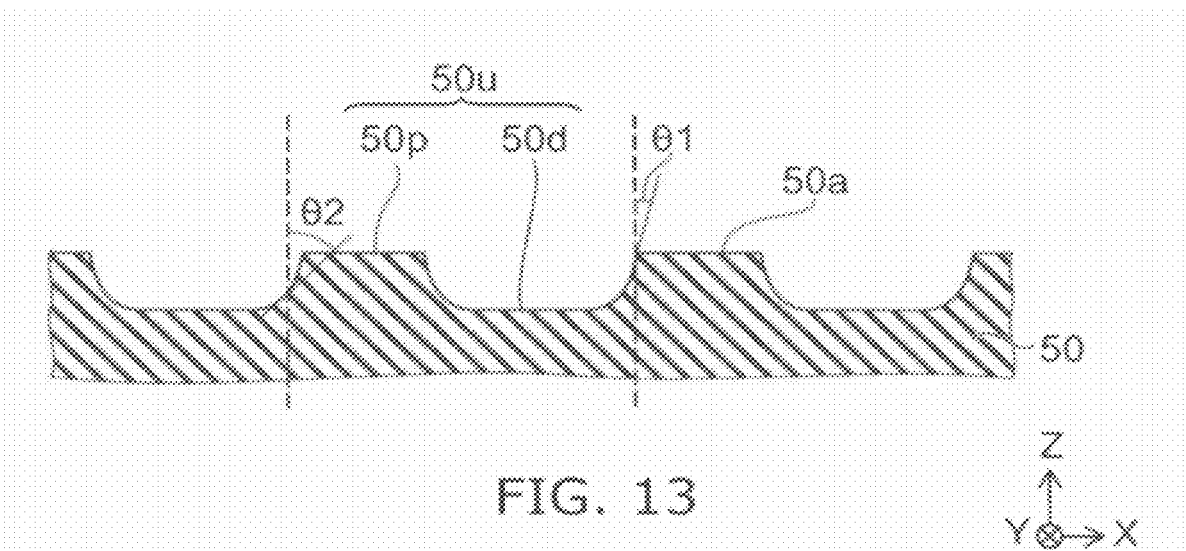
FIG. 13 is a schematic view illustrating a member used in the method for manufacturing a semiconductor light emitting device according to the first embodiment.

FIG. 13 is a schematic view illustrating a member used in the method for manufacturing a semiconductor light emitting device according to the first embodiment.

This figure is a schematic sectional view illustrating the configuration of an alternative first substrate 50 used in the manufacturing method according to the embodiment.

In this example, the protrusion 50p is continuous, and a plurality of depressions 50d are provided. In this case, the angle (upper portion slope angle $\theta 1$) between the side surface of the upper portion of the depression 50d and the Z-axis (the axis perpendicular to the major surface 50a) is preferably smaller than the angle (lower portion slope angle $\theta 2$) between the side surface of the lower portion of the depression 50d and the Z-axis.

Then, when the nitride semiconductor layer 10s is formed on the major surface 50a of the first substrate 50, an appropriate amount of gas is supplied to the bottom portion of the depression 50d. Thus, the cavity 50c can be stably formed while forming the thin film 65.

Figure 14:
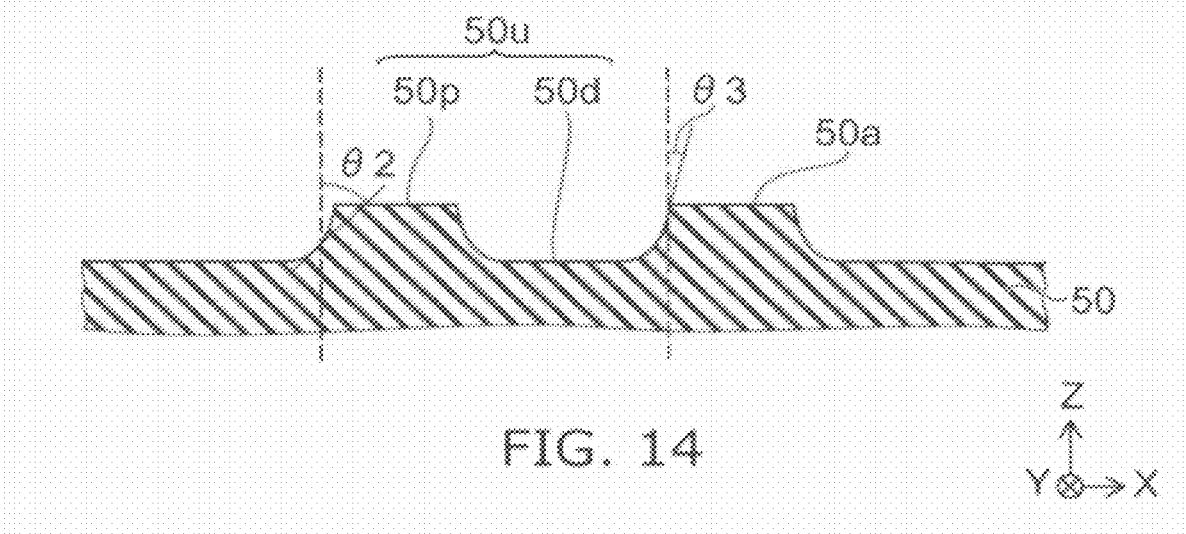
FIG. 14 is a schematic view illustrating a member used in the method for manufacturing a semiconductor light emitting device according to the first embodiment.

FIG. 14 is a schematic view illustrating a member used in the method for manufacturing a semiconductor light emitting device according to the first embodiment.

This figure is a schematic sectional view illustrating the configuration of an alternative first substrate 50 used in the manufacturing method according to the embodiment.

In this example, the depression 50d is continuous, and a plurality of protrusions 50p are provided. In this case, the angle (upper portion slope angle $\theta 3$) between the side surface of the upper portion of the protrusion 50p and the Z-axis is preferably smaller than the angle (lower portion slope angle θ4) between the side surface of the lower portion of the protrusion 50p and the Z-axis.

Then, when the nitride semiconductor layer 10s is formed on the major surface 50a of the first substrate 50, an appropriate amount of gas is supplied to the bottom portion of the depression 50d. Thus, the cavity 50c can be stably formed while forming the thin film 65.

Second Embodiment

In the embodiment, a first substrate 50 with a nitride semiconductor layer 10s formed thereon is prepared.

More specifically, a workpiece including a first substrate 50, a nitride semiconductor layer 10s including a light emitting layer 30, and a thin film 65 is prepared. The workpiece includes e.g. the stacked body including the first substrate 50 and the nitride semiconductor layer 10s, and the thin film 65 illustrated in FIG. 4B.

In the workpiece, the first substrate 50 has a major surface 50a provided with an unevenness 50u. The nitride semiconductor layer 10s is provided on the major surface 50a. The nitride semiconductor layer 10s includes e.g. the buffer layer 60, the first semiconductor layer 10, the light emitting layer 30, and the second semiconductor layer 20 described above. That is, the workpiece may have the configuration illustrated in FIG. 4C.

The thin film 65 is provided on the inner wall surface of the depression 50d of the unevenness 50u. The thin film 65 includes the same material as at least part of the nitride semiconductor layer 10s. The workpiece includes a cavity 50c provided in the space inside the depression 50d.

For instance, as illustrated in FIG. 5A, the workpiece can further include a p-side electrode 20e and a first barrier metal layer 15.

Figure 15:
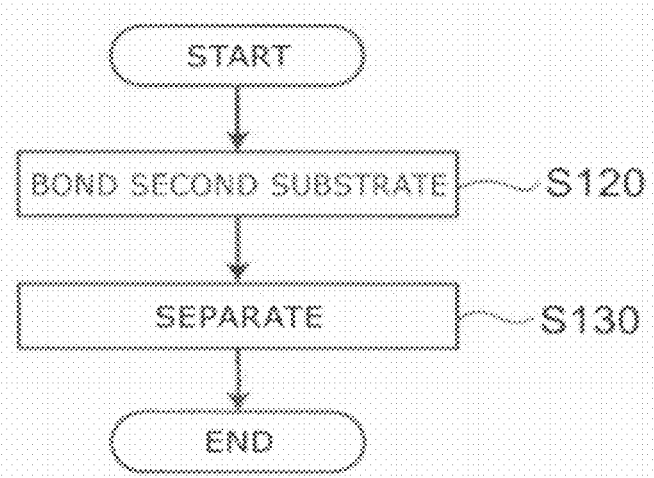
FIG. 15 is a flow chart illustrating a method for manufacturing a semiconductor light emitting device according to a second embodiment.

FIG. 15 is a flow chart illustrating the method for manufacturing a semiconductor light emitting device according to the second embodiment.

As shown in FIG. 15, the manufacturing method according to the embodiment includes a step for bonding the nitride semiconductor layer 10s of the workpiece to a second substrate 70 (step S120). For instance, the process described with reference to FIG. 10B is performed.

As shown in FIG. 15, the manufacturing method further includes a step for separating the first substrate 50 from the nitride semiconductor layer 10s by irradiating the nitride semiconductor layer 10s with light Lr via the first substrate 50 (step S130). That is, the process described with reference to FIG. 10C is performed.

More specifically, the separating step (step S130) includes causing the thin film 65 to absorb at least part of the light Lr so that the intensity of light applied to the portion (first portion 61) of the nitride semiconductor layer 10s facing the depression 50d is made lower than the intensity of light applied to the portion (second portion 62) of the nitride semiconductor layer 10s facing the protrusion 50p of the unevenness 50u.

Hence, the embodiment can provide a semiconductor light emitting device in which damage to the semiconductor layer in removing the growth substrate is suppressed.

As described above, in the manufacturing method, the nitride semiconductor layer 10s can include a buffer layer 60 provided between the first substrate 50 and the light emitting layer 30, a first semiconductor layer 10 provided between the buffer layer 60 and the light emitting layer 30, and a second semiconductor layer 20. The light emitting layer 30 is located between the first semiconductor layer 10 and the second semiconductor layer 20.

Thus, the manufacturing method according to the embodiment is applicable to manufacturing of a thin film type LED.

In the manufacturing method according to the embodiment, the first substrate 50 having an unevenness 50u is separated from the nitride semiconductor layer 10s while suppressing damage and peeling of the nitride semiconductor layer 10s. Furthermore, the nitride semiconductor layer 10s has high crystal quality. Thus, the embodiment can provide a semiconductor light emitting device having high output and low cost.

Third Embodiment

The embodiment relates to a semiconductor light emitting device wafer.

Figure 16:
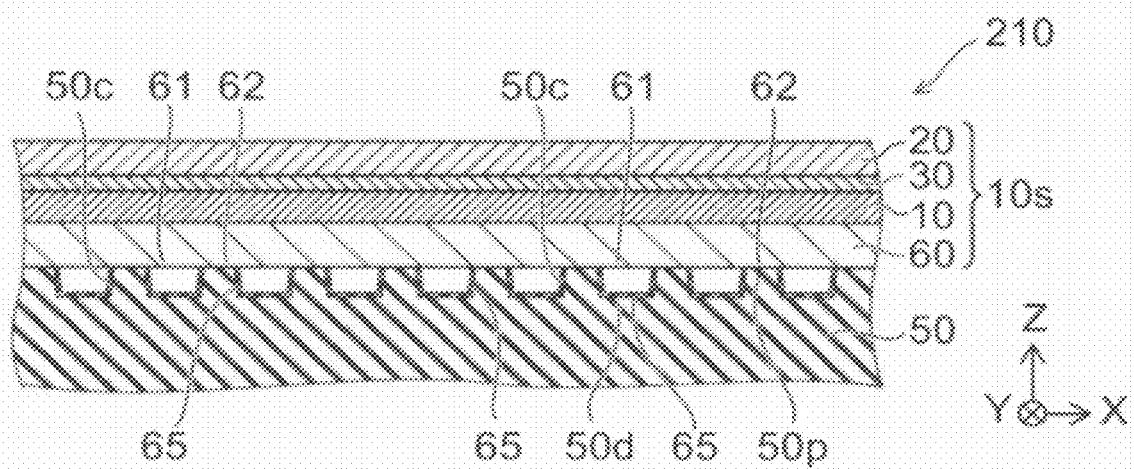
FIG. 16 is a schematic sectional view illustrating a semiconductor light emitting device wafer according to a third embodiment.

FIG. 16 is a schematic sectional view illustrating the configuration of a semiconductor light emitting device wafer according to the third embodiment.

As shown in FIG. 16, the semiconductor light emitting device wafer 210 according to the embodiment includes a base member (first substrate 50), a nitride semiconductor layer 10s, and a thin film 65. The first substrate 50 has a major surface 50a provided with an unevenness 50u. The nitride semiconductor layer 10s is provided on the major surface 50a. The nitride semiconductor layer 10s includes a light emitting layer 30. The thin film 65 is provided on the inner wall surface of the depression 50d of the unevenness 50u, and includes the same material as at least part of the nitride semiconductor layer 10s. The nitride semiconductor layer 10s forms a cavity 50c in the space inside the depression 50d.

By using the semiconductor light emitting device wafer 210, in the step for separating the first substrate 50 from the nitride semiconductor layer 10s by irradiating the nitride semiconductor layer 10s with light Lr via the first substrate 50, the thin film 65 is caused to absorb at least part of the light Lr. Thus, the intensity of light applied to the portion (first portion 61) of the nitride semiconductor layer 10s facing the depression 50d can be made lower than the intensity of light applied to the portion (second portion 62) of the nitride semiconductor layer 10s facing the protrusion 50p of the unevenness 50u.

The semiconductor light emitting device wafer 210 according to the embodiment can realize a semiconductor light emitting device in which damage to the semiconductor layer in removing the growth substrate is suppressed.

As shown in FIG. 16, in the semiconductor light emitting device wafer 210 according to the embodiment, the nitride semiconductor layer 10s can include a buffer layer 60 provided between the first substrate 50 and the light emitting layer 30, a first semiconductor layer 10 provided between the buffer layer 60 and the light emitting layer 30, and a second semiconductor layer 20. The light emitting layer 30 is located between the first semiconductor layer 10 and the second semiconductor layer 20.

Furthermore, the semiconductor light emitting device wafer 210 can further include e.g. a second semiconductor layer side electrode (e.g., p-side electrode 20e) described with reference to FIG. 4D.

Furthermore, the semiconductor light emitting device wafer 210 can further include e.g. a barrier metal film (e.g., first barrier metal layer 15) described with reference to FIG. 5A.

Furthermore, the semiconductor light emitting device wafer 210 can further include e.g. a second substrate 70 described with reference to FIG. 5B.

The embodiments can provide a method for manufacturing a semiconductor light emitting device and a semiconductor light emitting device wafer in which damage to the semiconductor layer in removing the growth substrate is suppressed.

In the description, the "nitride semiconductor" includes semiconductors of the chemical formula $B_xIn_yAl_zGa_{1-x-y-z}N$ ($0 \leq x \leq 1$, $0 \leq y \leq 1$, $0 \leq z \leq 1$, $x+y+z \leq 1$) of any compositions with the composition ratios x, y, and z varied in the respective ranges. Furthermore, the "nitride semiconductor" also includes those of the above chemical formula further containing Group V elements other than N (nitrogen), those further containing various elements added for controlling various material properties such as conductivity type, and those further containing various unintended elements.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

The embodiments of the invention have been described above with reference to examples. However, the invention is not limited to these examples. For instance, any specific configurations of various components such as the nitride semiconductor layer, buffer layer, first semiconductor layer, second semiconductor layer, light emitting layer, electrode, barrier metal layer (film), bonding layer, protective layer, translucent layer, and support substrate included in the semiconductor light emitting device, and the first substrate used in the method for manufacturing a semiconductor light emitting device, are encompassed within the scope of the invention as long as those skilled in the art can similarly practice the invention and achieve similar effects by suitably selecting such configurations from conventionally known ones.

Further, any two or more components of the specific examples may be combined within the extent of technical feasibility and are included in the scope of the invention to the extent that the purport of the invention is included.

In addition, those skilled in the art can suitably modify and implement the method for manufacturing a semiconductor light emitting device and the semiconductor light emitting device wafer described above in the embodiments of the invention. All the methods for manufacturing a semiconductor light emitting device and the semiconductor light emitting device wafers thus modified are also encompassed within the scope of the invention as long as they fall within the spirit of the invention.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a semiconductor light emitting device, comprising:
    forming a nitride semiconductor layer including a light emitting layer on a major surface of a first substrate, the major surface being provided with an unevenness having a depression and a protrusion;
    bonding the nitride semiconductor layer to a second substrate; and
    separating the first substrate from the nitride semiconductor layer by irradiating the nitride semiconductor layer with light via the first substrate,
    the forming the nitride semiconductor layer including leaving a cavity in a space inside the depression of the unevenness while forming a thin film on an inner wall surface of the depression of the unevenness, the thin film including a same material as at least a part of the nitride semiconductor layer, the nitride semiconductor layer including a first portion facing the depression and a second portion facing the protrusion, and
    the separating including causing the thin film to absorb at least a part of the light so that an intensity of the light applied to the first portion is made lower than an intensity of the light applied to the second portion; wherein
    the protrusion is continuous, and the depression is provided in a plurality, and
    an angle between a side surface of an upper portion of the depression and a first axis perpendicular to the major surface is smaller than an angle between a side surface of a lower portion of the depression and the first axis.

2. The method according to claim 1, wherein the forming the nitride semiconductor layer includes causing at least a part of a lower surface of the first portion to be parallel to the major surface.

3. The method according to claim 1, wherein an average angle between a first axis perpendicular to the major surface and a side surface of the unevenness is 20 degrees or more.

4. The method according to claim 1, wherein at least one of a width along a second axis parallel to the major surface of a top of the protrusion and a width along the second axis of a bottom of the depression is 0.5 micrometers or more and 3 micrometers or less.

5. The method according to claim 1, further comprising:
    reducing a thickness of the nitride semiconductor layer after the separating.

6. The method according to claim 1, wherein an area of the second portion is smaller than an area of the first portion.

7. The method according to claim 1, wherein the forming the nitride semiconductor layer includes:
    forming a buffer layer including a nitride semiconductor on the first substrate;
    forming a first semiconductor layer on the buffer layer, the first semiconductor layer including a nitride semiconductor and having a first conductivity type;
    forming the light emitting layer on the first semiconductor layer; and
    forming a second semiconductor layer on the light emitting layer, the second semiconductor layer including a nitride semiconductor and having a second conductivity type different from the first conductivity type.

8. The method according to claim 7, wherein the buffer layer includes GaN.

9. The method according to claim 7, wherein a thickness of the buffer layer is 0.5 micrometers or more and 5 micrometers or less.

10. The method according to claim 1, wherein the thin film includes GaN.

11. The method according to claim 1, wherein the first substrate is sapphire or SiC.

12. The method according to claim 1, wherein the light is KrF laser light.

13. A method for manufacturing a semiconductor light emitting device, comprising:

bonding a nitride semiconductor layer of a workpiece to a second substrate, the workpiece including:
  a first substrate having a major surface provided with an unevenness having a depression and a protrusion;
  the nitride semiconductor layer provided on the major surface and including a light emitting layer, the nitride semiconductor layer including a first portion facing the depression and a second portion facing the protrusion;
  a thin film provided on an inner wall surface of the depression of the unevenness and including a same material as at least a part of the nitride semiconductor layer; and
  a cavity provided in a space inside the depression; and
separating the first substrate from the nitride semiconductor layer by irradiating the nitride semiconductor layer with light via the first substrate,
the separating including causing the thin film to absorb at least a part of the light so that an intensity of the light applied to the first portion is made lower than an intensity of the light applied to the second portion; wherein
the protrusion is continuous, and the depression is provided in a plurality, and
an angle between a side surface of an upper portion of the depression and a first axis perpendicular to the major surface is smaller than an angle between a side surface of a lower portion of the depression and the first axis.

14. The method according to claim 13, wherein
the nitride semiconductor layer includes:
  a buffer layer provided between the light emitting layer and the first substrate and including a nitride semiconductor,
  a first semiconductor layer of a first conductivity type provided between the buffer layer and the light emitting layer and including a nitride semiconductor, and
  a second semiconductor layer of a second conductivity type different from the first conductivity type and including a nitride semiconductor, the light emitting layer being disposed between the first semiconductor layer and the second semiconductor layer.

15. The method according to claim 14, wherein the buffer layer includes GaN.

16. The method according to claim 14, wherein a thickness of the buffer layer is 0.5 micrometers or more and 5 micrometers or less.

17. The method according to claim 13, wherein the first substrate is sapphire or SiC.

* * * * *